United States Patent
Dai

(10) Patent No.: US 9,847,068 B2
(45) Date of Patent: Dec. 19, 2017

(54) SCAN DRIVING CIRCUIT AND LCD DEVICE

(71) Applicant: SHENZHEN CHINA STAR OPTOELECTRONICS TECHNOLOGY CO., LTD, Shenzhen (CN)

(72) Inventor: Chao Dai, Shenzhen (CN)

(73) Assignee: SHENZHEN CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 165 days.

(21) Appl. No.: 14/411,104

(22) PCT Filed: May 26, 2014

(86) PCT No.: PCT/CN2014/078376
§ 371 (c)(1),
(2) Date: Dec. 24, 2014

(87) PCT Pub. No.: WO2015/176327
PCT Pub. Date: Nov. 26, 2015

(65) Prior Publication Data
US 2016/0260405 A1 Sep. 8, 2016

(30) Foreign Application Priority Data

May 20, 2014 (CN) .......................... 2014 1 0212431

(51) Int. Cl.
G09G 3/36 (2006.01)
G11C 19/28 (2006.01)

(52) U.S. Cl.
CPC ........... *G09G 3/3677* (2013.01); *G11C 19/28* (2013.01); *G09G 2300/0408* (2013.01);
(Continued)

(58) Field of Classification Search
CPC ......... G09G 3/3677; G09G 2300/0408; G09G 2330/10; G09G 2330/12; G09G 2330/08;
(Continued)

(56) References Cited

U.S. PATENT DOCUMENTS

2009/0256794 A1  10/2009  Jang et al.
2009/0256831 A1  10/2009  Hsu et al.
(Continued)

FOREIGN PATENT DOCUMENTS

CN        1941208 A       4/2007
CN      101510404 A       8/2009
(Continued)

*Primary Examiner* — Temesghen Ghebretinsae
*Assistant Examiner* — Ivelisse Martinez Quiles

(57) ABSTRACT

A scan driving circuit includes a repair assembly, a pull-up assembly, a pull-up control assembly that drives the pull-up assembly, a pull-down maintaining assembly, and a reference low-level signal. When the pull-down maintaining assembly turns off in a work stage of a current scanning line, the repair assembly turns off. When the pull-down maintaining assembly turns on in the work stage of the current scanning line, the repair assembly is connected with the pull-down maintaining assembly. In the work stage of the current scanning line, the reference low-level signal is sent to the repair assembly via the turn-off unit, and turns off the pull-down maintaining assembly through the repair assembly.

16 Claims, 6 Drawing Sheets

(52) U.S. Cl.
   CPC ..... *G09G 2310/08* (2013.01); *G09G 2330/08* (2013.01); *G09G 2330/10* (2013.01); *G09G 2330/12* (2013.01)

(58) Field of Classification Search
   CPC .... G09G 2310/08; G09G 3/3674; G09G 3/36; G09G 2310/0267; G11C 19/28
   See application file for complete search history.

(56) References Cited

U.S. PATENT DOCUMENTS

2014/0192039 A1\* 7/2014 Wang ................... G11C 19/28
  345/213
2015/0294636 A1\* 10/2015 Yu ....................... G09G 3/3655
  345/204

FOREIGN PATENT DOCUMENTS

| | | | |
|---|---|---|---|
| CN | 101609718 A | \* | 12/2009 |
| CN | 103198782 A | | 7/2013 |
| CN | 103247276 A | | 8/2013 |
| CN | 103474038 A | | 12/2013 |
| CN | 103680388 A | | 3/2014 |
| CN | 103745700 A | | 4/2014 |
| CN | 103761952 A | | 4/2014 |
| JP | 2009134814 A | | 6/2009 |

\* cited by examiner

SCAN DRIVING CIRCUIT AND LCD DEVICE

TECHNICAL FIELD

The present disclosure relates to the field of display devices, and more particularly to a scan driving circuit and a liquid crystal display (LCD) device.

BACKGROUND

In a typical gate driver on array (GOA) circuit, various reasons, such as poor etching exposure, cause thin film transistors (TFTs) to malfunction or be short circuited, which causes the GOA circuit to poorly function, and even results in failure of the GOA circuit, thereby affecting product yield.

SUMMARY

The aim of the present disclosure is to provide a scan driving circuit and a liquid crystal display (LCD) device capable of improving product yield.

The aim of the present disclosure is achieved by the following methods.

A scan driving circuit comprises a repair assembly, a pull-up assembly, a pull-up control assembly that drives the pull-up assembly, a pull-down maintaining assembly, a reference low-level signal, and a turn-off unit. An output end of the pull-up assembly is coupled to a current scanning line, a clock scanning signal is sent to an input end of the pull-up assembly, and a control end of the pull-up assembly is coupled to an output end of the pull-up control assembly. A pull-up control signal is sent to a control end of the pull-up control assembly, and the reference low-level signal is sent to the output end of the pull-up control assembly and the current scanning line through the pull-down maintaining assembly. An input end of the pull-down maintaining assembly is coupled to the output end of the pull-up control assembly, and the reference low-level signal is sent to an output end of the pull-down maintaining assembly. An input end of the turn-off unit is coupled to the pull-down maintaining assembly, a control end of the turn-off unit is coupled to the output end of the pull-up control assembly, and the reference low-level signal is sent to an output end of the turn-off unit. An input end of the repair assembly is coupled to the pull-down maintaining assembly, the reference low-level signal is sent to an output end of the repair assembly through the turn-off unit, and a control end of the repair assembly is coupled to the output end of the pull-up control assembly.

When the pull-down maintaining assembly turns off in a work stage of the current scanning line, the repair assembly turns off. When the pull-down maintaining assembly turns on in the work stage of the current scanning line, the repair assembly is connected with the pull-down maintaining assembly. In the work stage of the current scanning line, the reference low-level signal is sent to the repair assembly via the turn-off unit, and turns off the pull-down maintaining assembly through the repair assembly.

Furthermore, the pull-down maintaining assembly comprises a first pull-down maintaining assembly, where the first pull-down maintaining assembly comprises a first pull-down maintaining unit and a first pull-down maintaining control unit that drives the first pull-down maintaining unit. The first pull-down maintaining unit comprises a second controllable switch. The scan driving circuit further comprises a first pull-down maintaining signal and a second pull-down maintaining signal, where logical operation of the first pull-down maintaining signal is opposite to logical operation of the second pull-down maintaining signal. The first pull-down maintaining control unit comprises a third controllable switch, a fourth controllable switch, and a fifth controllable switch. An input end of the second controllable switch is coupled to the output end of the pull-up control assembly, the reference low-level signal is sent to an output end of the second controllable switch, and a control end of the second controllable switch is coupled to the input end of the repair assembly.

The first pull-down maintaining signal is sent to a control end and an input end of the third controllable switch, and an output end of the third controllable switch is coupled to a control end of the fourth controllable switch. The second pull-down maintaining signal is sent to a control end of the fifth controllable switch, the first pull-down maintaining signal is sent to an input end of the fifth controllable switch, and an output end of the fifth controllable switch is coupled to the control end of the second controllable switch. The first pull-down maintaining signal is sent to an input end of the fourth controllable switch, and an output end of the fourth controllable switch is coupled to the control end of the controllable switch.

When the second controllable switch turns off in the work stage of the current scanning line, the repair assembly is off. When the second controllable switch turns on in the work stage of the current scanning line, the repair assembly is on. In the work stage of the current scanning line, the reference low-level signal is sent to the repair assembly via the turn-off unit, and reduces electric potential of the control end of the second controllable switch through the repair assembly to turn off the second controllable switch. In the present disclosure, when the second controllable switch cannot normally turn off in the work stage of the current scanning line, the repair assembly turns on to turn off the second controllable switch, which makes a gate driver on array (GOA) circuit to normally work. Thus, current leakage and failure of the GOA circuit because the second controllable switch cannot turn off, is avoided.

Furthermore, the first pull-down maintaining assembly further comprises a first controllable switch, an input end of the first controllable switch is coupled to the current scanning line, the reference low-level signal is sent to an output end of the first controllable switch, and a control end of the first controllable switch is coupled to the input end of the repair assembly. The control end of the first controllable switch is coupled to the output end of the fourth controllable switch and the control end of the second controllable switch.

When the first and second controllable switches turn off in the work stage of the current scanning line, the repair assembly turns off. When the first and second controllable switches turn on in the work stage of the current scanning line, the repair assembly turns on. In the work stage of the current scanning line, the reference low-level signal is sent to the repair assembly, and reduces electric potentials of the control ends of the first and second controllable switches through the repair assembly to turn off the first and second controllable switches. In the present disclosure, when the first controllable switch cannot normally turn off in the work stage of the current scanning line, the repair assembly turns on to turn off the first controllable switch, which makes the GOA circuit to normally work. Thus, the current leakage and the failure of the GOA circuit because the first controllable switch cannot turn off, is avoided.

Furthermore, the pull-down maintaining assembly further comprises a second pull-down maintaining assembly, where the second pull-down maintaining assembly comprises a second pull-down maintaining unit and a second pull-down maintaining control unit that drives the second pull-down maintaining unit. The second pull-down maintaining unit comprises an eighth controllable switch and a ninth controllable switch. The second pull-down maintaining control unit comprises a tenth controllable switch, an eleventh controllable switch, and a twelfth controllable switch.

An input end of the ninth controllable switch is couple to the output end of the pull-up control assembly, the reference low-level signal is sent to an output end of the ninth controllable switch, and a control end of the ninth controllable switch is coupled to the input end of the repair assembly.

An input end of the eighth controllable switch is coupled to the current scanning line, the reference low-level signal is sent to an output end of the eighth controllable switch, and a control end of the eighth controllable switch is coupled to the input end of the repair assembly. The control end of the eighth controllable switch is coupled to an output end of the eleventh controllable switch and the control end of the second controllable switch.

The second pull-down maintaining signal is sent to a control end and an input end of the tenth controllable switch, and an output end of the tenth controllable switch is coupled to a control end of the eleventh controllable switch. The first pull-down maintaining signal is sent to a control end of the twelfth controllable switch, the second pull-down maintaining signal is sent to an input end of the twelfth controllable switch, and an output end of the twelfth controllable switch is coupled to the control ends of the eighth and the ninth controllable switches. The second pull-down maintaining signal is sent to an input end of the eleventh controllable switch, and the output end of the eleventh controllable switch is coupled to the control ends of the eighth and the ninth controllable switches.

When the first controllable switch, the second controllable switch, the eighth controllable switch, and the ninth controllable switch turn off in the work stage of the current scanning line, the repair assembly turns off. When the first controllable switch, the second controllable switch, the eighth controllable switch, and the ninth controllable switch turn on in the work stage of the current scanning line, the repair assembly turns on. In the work stage of the current scanning line, the reference low-level signal is sent to the repair assembly via the turn-off unit, and reduces electric potentials of the control ends of the first controllable switch, the second controllable switch, the eighth controllable switch, and the ninth controllable switch through the repair assembly to turn off the first controllable switch, the second controllable switch, the eighth controllable switch, and the ninth controllable switch. In the present disclosure, the logical operation of the first pull-down maintaining signal is opposite to the logical operation of the second pull-down maintaining signal, and the first pull-down maintaining assembly and the second pull-down maintaining assembly are in interlock state, thus, periods of the first pull-down maintaining signal and the second pull-down maintaining signal are not limited. Fluctuations of a response time and the electric potential exist in a switching process of the assemblies, which slightly affects the work of the current scanning line. Thus, in the present disclosure, the first pull-down maintaining signal having a low frequency and the second pull-down maintaining signal having the low frequency are used, and time of switching of the first pull-down maintaining signal and the second pull-down maintaining signal is a blanking time between each frame image. In a typical GOA circuit, a potential difference Vgs between the control end of the first controllable switch and the output end of the first controllable switch, a potential difference Vgs between the control end of the second controllable switch and the output end of the second controllable switch, a potential difference Vgs between the control end of the eighth controllable switch and the output end of the eighth controllable switch, and a potential difference Vgs between the control end of the ninth controllable switch and the output end of the ninth controllable switch are often greater than zero due to some reasons such as charge accumulation, thus, the current leakage of the GOA circuit is caused, electric potentials of the output end of the pull-up control assembly and the current scanning line are affected, and the GOA circuit is further affected. Thus, in the present disclosure, the electric potentials of the first pull-down maintaining signal LC1 having the low frequency and the second pull-down maintaining signal LC2 having the low frequency are less than the reference low-level signal VSS, the potential difference Vgs being less than zero is ensured, which makes the first controllable switch, the second controllable switch, the eighth controllable switch, and the ninth controllable switch be in a unstable state, thereby avoiding the current leakage of the GOA circuit.

Furthermore, the scan driving circuit further comprises a fifteenth controllable switch. A control end of the fifteenth controllable switch is coupled to the output end of the pull-up control assembly, and the fifteenth controllable switch is arranged between the control ends of the first and second controllable switch and the control ends of the eighth and ninth controllable switch.

When the first controllable switch, the second controllable switch, the eighth controllable switch, and the ninth controllable switch turn off in the work stage of the current scanning line, the repair assembly turns off. When the first controllable switch, the second controllable switch, the eighth controllable switch, and the ninth controllable switch turn on in the work stage of the current scanning line because one or more of the fifth controllable switch, the twelfth controllable switch, and the fifteenth controllable switch do not work, the repair assembly turns on. In the work stage of the current scanning line, the reference low-level signal is sent to the repair assembly via the turn-off unit, and reduces electric potentials of the control ends of the first controllable switch, the second controllable switch, the eighth controllable switch, and the ninth controllable switch through the repair assembly to turn off the first controllable switch, the second controllable switch, the eighth controllable switch, and the ninth controllable switch. When the eighth controllable switch and the ninth controllable switch cannot normally turn off in the work stage of the current scanning line, the repair assembly turns on to turn off the eighth controllable switch and the ninth controllable switch, which makes the GOA circuit to normally work. Thus, the current leakage and the failure of the GOA circuit because the eighth controllable switch and the ninth controllable switch cannot turn off, is avoided.

Furthermore, the turn-off unit comprises a sixth controllable switch and a thirteenth controllable switch. Control ends of the sixth controllable switch and the thirteenth controllable switch are coupled to the output end of the pull-up control assembly, the reference low-level signal is sent to output ends of the sixth controllable switch and the thirteenth controllable switch, an input end of the six controllable switch is coupled to the control ends of the first controllable switch and the second controllable switch, and an input end of the thirteenth controllable switch is coupled to the control ends of the eighth controllable switch and the ninth controllable switch.

The repair assembly comprises a first connecting unit and a second connecting unit. The first connecting unit comprises a first sheet metal, a second sheet metal, and a first insulator. The second connecting unit comprises a third sheet metal, a fourth sheet metal, and a second insulator. The first insulator is arranged between the first sheet metal and the second sheet metal, the second insulator is arranged between the third sheet metal and the fourth sheet metal. The first sheet metal is coupled to the control ends of the first controllable switch and the second controllable switch, and the reference low-level signal is sent to the second sheet metal through the sixth controllable switch. The third sheet metal is coupled to the control ends of the eighth controllable switch and the ninth controllable switch, and the reference low-level signal is sent to the fourth sheet metal through the thirteenth controllable switch.

When the first controllable switch, the second controllable switch, the eighth controllable switch, and the ninth controllable switch turn on in the work stage of the current scanning line because one or more of the fifth controllable switch, the twelfth controllable switch, and the fifteenth controllable switch do not work, insulation function of the first insulator and the second insulator are failure, the first sheet metal is connected with the second sheet metal, and the third sheet metal is connected with the fourth sheet metal. In the work stage of the current scanning line, the reference low-level signal is sent to the repair assembly via the sixth controllable switch and the thirteenth controllable switch, and reduces the electric potentials of the control ends of the first controllable switch, the second controllable switch, the eighth controllable switch, and the ninth controllable switch through the repair assembly to turn off the first controllable switch, the second controllable switch, the eighth controllable switch, and the ninth controllable switch. In the present disclosure, structures of the first connecting unit and the second connecting unit are easy to repair each of fault points. Taking the first connecting unit as an example, when the first controllable switch and the second controllable switch normally work, electric potentials of the first sheet metal and the second sheet metal are same in the work stage of the current scanning line, thus, the insulation function of the first insulator is effective. When the first controllable switch and the second controllable switch cannot normally turn off in the work stage of the current scanning line, the insulation function of the first insulator is failure using radium irradiation method, and the first sheet metal and the second sheet metal are connected to each other. Thus, the reference low-level signal can reduce the electric potentials of the control ends of the first controllable switch and the second controllable switch through the sixth controllable switch and the first connecting unit to turn off the first controllable switch and the second controllable switch, which makes the GOA circuit to normally work, thereby avoiding influence of the output of the GOA circuit due to the current leakage, and the failure of the GOA circuit due to failure of some TFTs. Thus, the product yield is improved.

Furthermore, the scan driving circuit further comprises a first wire, a second wire, a third wire, and a fourth wire. The repair assembly further comprises a first via hole unit and a second via hole unit. A first end of the first via hole unit is coupled to the third wire, and a second end of the first via hole unit is coupled to the first wire through the first connecting unit. A first end of the second via hole unit is coupled to the fourth wire, and a second end of the second via hole unit is coupled to the second wire through the second connecting unit. The third wire is coupled to the control end of the fourth controllable switch, and the reference low-level signal is sent to the third wire through the sixth controllable switch. The fourth wire is coupled to the control end of the eleventh controllable switch, and the reference low-level signal is sent to the fourth wire through the thirteenth controllable switch. The first wire is coupled to the control ends of the first controllable switch and the second controllable switch, and is coupled to the fifteenth controllable switch. The second wire is coupled to the control ends of the eighth controllable switch and the ninth controllable switch, and is coupled to the fifteenth controllable switch. the first via hole unit connects the first wire with the third wire, where a layer configured with the first wire is different with a layer configured with the third wire. And the second via hole unit connects the second wire with the fourth wire, where a layer configured with the second wire is different with a layer configured with the fourth wire.

Furthermore, the turn-off unit comprises a sixth controllable switch, a thirteenth controllable switch, a twenty-second controllable switch, and a twenty-third controllable switch. Control ends of the sixth controllable switch, the thirteenth controllable switch, the twenty-second controllable switch, and the twenty-third controllable switch are coupled to the output end of the pull-up control assembly. The reference low-level signal is sent to output ends of the sixth controllable switch, the thirteenth controllable switch, the twenty-second controllable switch, and the twenty-third controllable switch. An input end of the twenty-second controllable switch is coupled to the control ends of the first controllable switch and the second controllable switch, an input end of the sixth controllable switch is coupled to the control end of the fourth controllable switch, an input end of the twenty-third controllable switch is coupled to the control ends of the eighth controllable switch and the ninth controllable switch, and an input end of the thirteenth controllable switch is coupled to the control end of the eleventh controllable switch.

The repair assembly comprises a first connecting unit and a second connecting unit. The first connecting unit comprises a first sheet metal, a second sheet metal, and a first insulator. The second connecting unit comprises a third sheet metal, a fourth sheet metal, and a second insulator. The first insulator is arranged between the first sheet metal and the second sheet metal, the second insulator is arranged between the third sheet metal and the fourth sheet metal. The first sheet metal is coupled to the control ends of the first controllable switch and the second controllable switch, and the reference low-level signal is sent to the second sheet metal through the sixth controllable switch. The third sheet metal is coupled to the control ends of the eighth controllable switch and the ninth controllable switch, and the reference low-level signal is sent to the fourth sheet metal through the twenty-third controllable switch.

When the first controllable switch, the second controllable switch, the eighth controllable switch, and the ninth controllable switch turn on in the work stage of the current scanning line because one or more of the fifth controllable switch, the twelfth controllable switch, and the fifteenth controllable switch do not work, the insulation function of the first insulator and the second insulator are failure, the first sheet metal is connected with the second sheet metal, and the third sheet metal is connected with the fourth sheet metal. In the work stage of the current scanning line, the reference low-level signal is sent to the repair assembly via the twenty-second and twenty-third controllable switches, and reduces the electric potentials of the control ends of the first controllable switch, the second controllable switch, the eighth controllable switch, and the ninth controllable switch through the repair assembly to turn off the first controllable switch, the second controllable switch, the eighth controllable switch, and the ninth controllable switch.

Furthermore, the scan driving circuit comprises a first wire, a second wire, a third wire, and a fourth wire. The repair assembly further comprises a first via hole unit and a second via hole unit. A first end of the first via hole unit is coupled to the third wire, and a second end of the first via hole unit is coupled to the first wire through the first connecting unit. A first end of the second via hole unit is coupled to the fourth wire, and a second end of the second via hole unit is coupled to the second wire through the second connecting unit. The third wire is coupled to the control end of the fourth controllable switch, and the reference low-level signal is sent to the third wire through the sixth controllable switch. The fourth wire is coupled to the control end of the eleventh controllable switch, and the reference low-level signal is sent to the fourth wire through the thirteenth controllable switch. The first wire is coupled to the control ends of the first controllable switch and the second controllable switch, and is coupled to the fifteenth controllable switch. The second wire is coupled to the control ends of the eighth controllable switch and the ninth controllable switch, and is coupled to the fifteenth controllable switch.

Furthermore, the repair assembly comprises a detection output unit and a repair line. The turn-off unit comprises a sixth controllable switch, a thirteenth controllable switch, a twenty-second controllable switch, a twenty-third controllable switch, a twenty-fourth controllable switch, and a twenty-fifth controllable switch. Control ends of the sixth controllable switch and the thirteenth controllable switch are coupled to the output end of the pull-up control assembly, the reference low-level signal is sent to output ends of the sixth controllable switch and the thirteenth controllable switch, an input end of the six controllable switch is coupled to the control ends of the first controllable switch and the second controllable switch, and an input end of the thirteenth controllable switch is coupled to the control ends of the eighth controllable switch and the ninth controllable switch.

Control ends of the twenty-second controllable switch and the twenty-third controllable switch are coupled to the output end of the pull-up control assembly, and the reference low-level signal is sent to output ends of the twenty-second controllable switch and the twenty-third controllable switch. Control ends of the twenty-fourth controllable switch and the twenty-fifth controllable switch are coupled to the repair line, an input end of the twenty-fourth controllable switch is coupled to the control ends of the first controllable switch and the second controllable switch, and an output end of the twenty-fourth controllable switch is coupled to an input end of the twenty-second controllable switch. An input end of the twenty-fifth controllable switch is coupled to the control ends of the eighth controllable switch and the ninth controllable switch, and an output end of the twenty-fifth controllable switch is coupled to an input end of the twenty-third controllable switch.

A first end of the detection output unit is coupled to the control ends of the first controllable switch and the second controllable switch, and the control ends of the eighth controllable switch and the ninth controllable switch. A second end of the detection output unit is coupled to the repair line.

When the first controllable switch, the second controllable switch, the eighth controllable switch, and the ninth controllable switch turn off in the work stage of the current scanning line, the detection output unit outputs a low-level signal to the repair line, and the repair line controls the twenty-second controllable switch, the twenty-third controllable switch, the twenty-fourth controllable switch, and the twenty-fifth controllable switch to turn off.

When the first controllable switch, the second controllable switch, the eighth controllable switch, and the ninth controllable switch turn on in the work stage of the current scanning line because one or more of the fifth controllable switch, the twelfth controllable switch, and the fifteenth controllable switch do not work, the detection output unit outputs a high-level signal to the repair line, and the repair line controls the twenty-second controllable switch, the twenty-third controllable switch, the twenty-fourth controllable switch, and the twenty-fifth controllable switch to turn on. The high level of the output end of the pull-up control assembly controls the sixth controllable switch and the thirteenth controllable switch to turn on, the reference low-level signal reduces the electric potentials of the control ends of the first controllable switch, the second controllable switch, the eighth controllable switch, and the ninth controllable switch through the twenty-second controllable switch, the twenty-third controllable switch, the twenty-fourth controllable switch, and the twenty-fifth controllable switch, and controls the first controllable switch, the second controllable switch, the eighth controllable switch, and the ninth controllable switch to turn off.

Furthermore, at least two groups of scan driving circuits are arranged. The first end of the detection output unit is coupled to the control ends of the first and second controllable switches of each of the scan driving circuits, and is coupled to the control ends of the eighth and ninth controllable switches of each of the scan driving circuits. The second end of the detection output unit is coupled to the repair line.

When the detection output unit detects that anyone or more of the first controllable switch, the second controllable switch, the eighth controllable switch, and the ninth controllable switch of each of the scan driving circuits are at the high level state in the work stage of the current scanning line and are on, the detection output unit irreversibly outputs the high level signal to the repair line, and the repair line controls the first controllable switch, the second controllable switch, the eighth controllable switch, and the ninth controllable switch of each of the scan driving circuits to turn off in the work stage of the current scanning line.

Furthermore, the pull-up control assembly comprises a seventeenth controllable switch, an output end of the seventeenth controllable switch is coupled to the control end of the pull-up assembly, and the pull-up control signal is sent to control and input ends of the seventeenth controllable switch. The pull-up assembly comprises an eighteenth controllable switch, a control end of the eighteenth controllable switch is coupled to the output end of the pull-up control assembly, the clock scanning signal is sent to an input end of the eighteenth controllable switch, and an output end of the eighteenth controllable switch is coupled to the current scanning line. The scan driving circuit further comprises a storage capacitor Cb, a first end of the storage capacitor Cb is coupled to the output end of the pull-up control assembly and the control end of the pull-up assembly, and a second end of the storage capacitor Cb is coupled to the output end of the pull-up assembly. The scan driving circuit further comprises a pull-down assembly comprising a twentieth controllable switch and a twenty-first controllable switch, control ends of the twentieth controllable switch and the twenty-first controllable switch are coupled to a next scanning line, the reference low-level signal is sent to output ends of the twentieth controllable switch and the twenty-first controllable switch, an input end of the twentieth controllable switch is coupled to the current scanning line, and an input end of the twenty-first controllable switch is coupled to the output end of the pull-up control assembly. When the current scanning line works, the storage capacitor increases voltage of the output end of the pull-up control assembly to turn on the pull-up assembly, where the voltage of the output end of the pull-up control assembly is a same as voltage of the control end of the pull-up assembly. The pull-down assembly is used to reduce voltages of the output end of the pull-up control assembly and the current scanning line.

A liquid crystal display (LCD) device comprises any one of the above-mentioned scan driving circuit.

It should be understood that in the scan driving circuit, especially the pull-down maintaining assembly of the scan driving circuit, various reasons, such as poor etching exposure, causes some main thin film transistors (TFTs) to malfunction or be short circuited, which causes the pull-down maintaining assembly not to work normally, causes poor functionality of a gate driver on array (GOA) circuit, and even results in failure of the GOA circuit, thereby affecting product yields. In the present disclosure, when the scan driving circuit cannot normally work, especially the pull-down maintaining assembly of the scan driving circuit cannot work, the repair assembly can substitute a partial circuit of the disabled pull-down maintaining assembly to work, which makes the scan driving circuit to normally work, thereby improving the product yield.

DETAILED DESCRIPTION

The present disclosure will further be described in detail in accordance with the figures and the exemplary examples.

Figure 1:
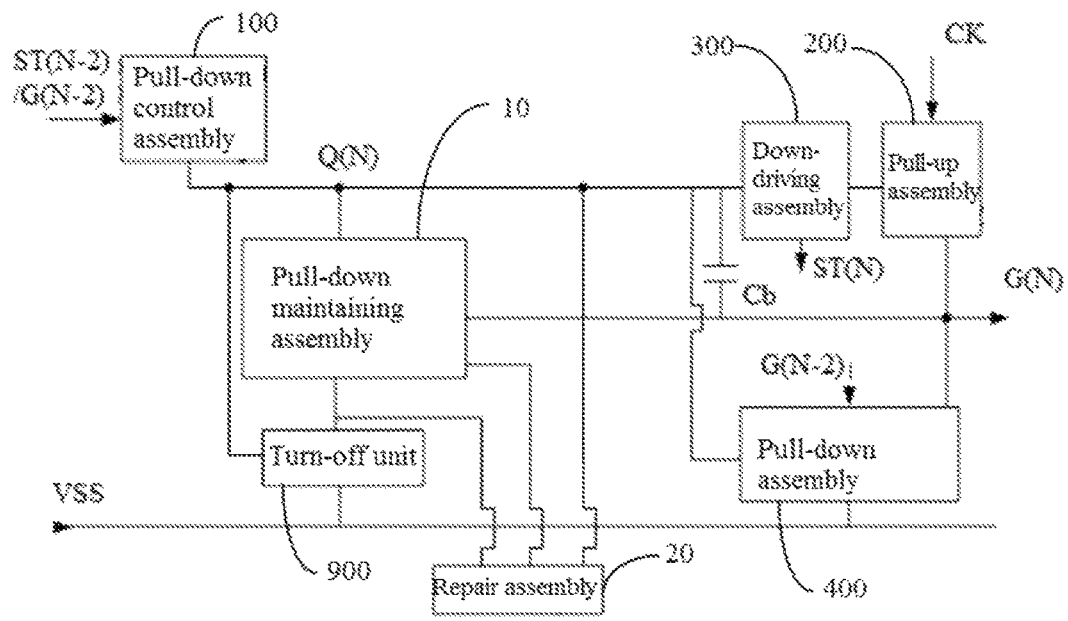
FIG. 1 is a schematic diagram of a scan driving circuit of the present disclosure.

FIG. 1 is a schematic diagram of a scan driving circuit, where the scan driving circuit comprises a repair assembly 20, a pull-up assembly 200, a pull-up control assembly 100 that drives the pull-up assembly 200, a down-driving assembly 300, a pull-down maintaining assembly 10, and a reference low-level signal VSS (logic 0). The scan driving circuit further comprises a turn-off unit 900. An output end of the pull-up assembly 200 is coupled to a current scanning line G (N), a clock scanning signal CK is sent to an input end of the pull-up assembly 200, and a control end of the pull-up assembly 200 is coupled to an output end Q (N) of the pull-up control assembly 100. The down-driving assembly 300 outputs a pull-up control signal ST(N). A pull-up control signal ST (N–2)/G (N–2) is sent to a control end of the pull-up control assembly 100, and the reference low-level signal VSS is sent to the output end Q (N) of the pull-up control assembly 100 and the current scanning line G (N) through the pull-down maintaining assembly 10. An input end of the pull-down maintaining assembly 10 is coupled to the output end Q (N) of the pull-up control assembly 100, and the reference low-level signal VSS is sent to an output end of the pull-down maintaining assembly 10. An input end of the turn-off unit 900 is coupled to the pull-down maintaining assembly 10, a control end of the turn-off unit 900 is coupled to the output end Q (N) of the pull-up control assembly 100, and the reference low-level signal is sent to an output end of the turn-off unit 900. An input end of the repair assembly 20 is coupled to the pull-down maintaining assembly 10, the reference low-level signal is sent to an output end of the repair assembly 20 through the turn-off unit 900, and a control end of the repair assembly 20 is coupled to the output end Q (N) of the pull-up control assembly 100.

When the pull-down maintaining assembly 10 turns off in a work stage of the current scanning line G (N), the repair assembly 20 turns off. When the pull-down maintaining assembly 10 turns on in the work stage of the current scanning line G (N), the repair assembly 20 is connected with the pull-down maintaining assembly 10. In the work stage of the current scanning line, the reference low-level signal VSS is sent to the repair assembly 20 via the turn-off unit 900, and is used to turn off the pull-down maintaining assembly 10 through the repair assembly 20.

It should be understood that in the scan driving circuit, especially the pull-down maintaining assembly 10 of the scan driving circuit, various reasons, such as poor etching exposure, cause some main thin film transistors (TFTs) to malfunction or be short circuited, which causes the pull-down maintaining assembly not to work normally, causes poor functionality of a gate driver on array (GOA) circuit, and even results in failure of the GOA circuit, thereby affecting product yields. In the present disclosure, when the scan driving circuit cannot normally work, especially the pull-down maintaining assembly of the scan driving circuit cannot work, the repair assembly can substitute a partial circuit of the disabled pull-down maintaining assembly to work, which makes the scan driving circuit to normally work, thereby improving the product yield.

Example 1

Figure 2:
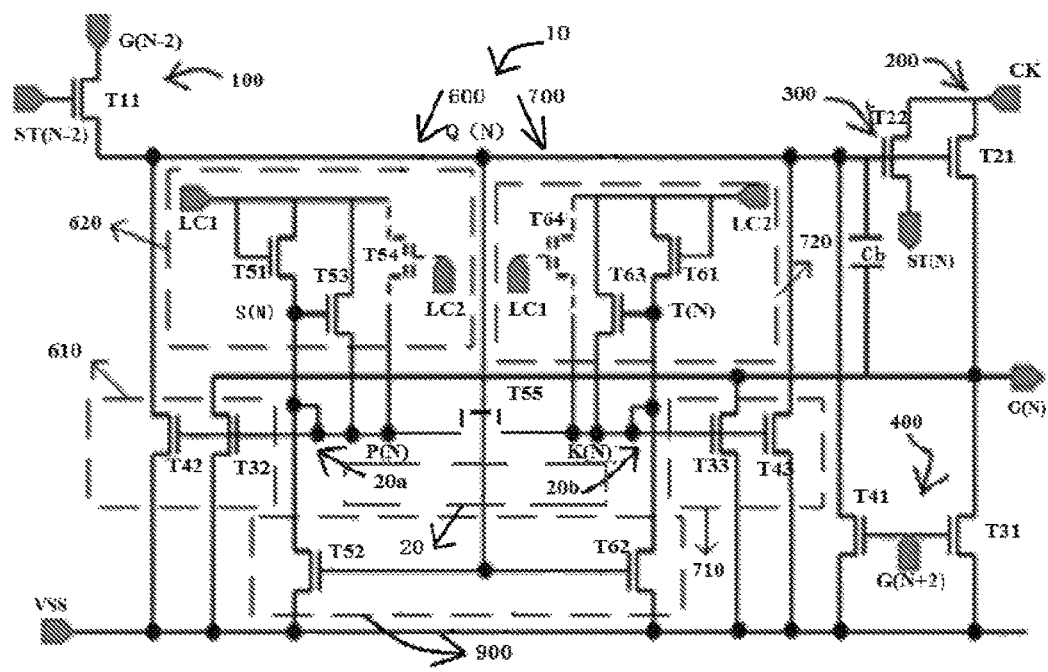
FIG. 2 is a schematic diagram of a first example of the present disclosure.

FIG. 2 is a schematic diagram of the scan driving circuit of a first example of the present disclosure. The pull-down maintaining assembly 10 comprises a first pull-down maintaining assembly 600, where the first pull-down maintaining assembly 600 comprises a first pull-down maintaining unit 610 and a first pull-down maintaining control unit 620 that drives the first pull-down maintaining unit 610. The first pull-down maintaining unit 610 comprises a second controllable switch T42. The scan driving circuit further comprises a first pull-down maintaining signal LC1 and a second pull-down maintaining signal LC2, where logical operation of the first pull-down maintaining signal LC1 is opposite to logical operation of the second pull-down maintaining signal LC2. The first pull-down maintaining control unit 620 comprises a third controllable switch T51, a fourth controllable switch T53, and a fifth controllable switch T54. An input end of the second controllable switch T42 is coupled to the output end of the pull-up control assembly 100, the reference low-level signal VSS is sent to an output end of the second controllable switch T42, and a control end of the second controllable switch T42 is coupled to the input end of the repair assembly 20.

The pull-up control assembly 100 comprises a seventeenth controllable switch T11, where an output end of the seventeenth controllable switch T11 is coupled to the control end of the pull-up assembly 200, and the pull-up control signal ST (N−2)/G(N−2) is sent to a control end and an input end of the seventeenth controllable switch T11. The pull-up assembly 200 comprises an eighteenth controllable switch T21, where a control end of the eighteenth controllable switch T21 is coupled to the output end Q (N) of the pull-up control assembly 100, the clock scanning signal CK is sent to an input end of the eighteenth controllable switch T21, and an output end of the eighteenth controllable switch T21 is coupled to the current scanning line G (N). The scan driving circuit further comprises a storage capacitor Cb, a first end of the storage capacitor Cb is coupled to the output end Q (N) of the pull-up control assembly 100 and the control end of the pull-up assembly 200, and a second end of the storage capacitor Cb is coupled to the output end of the pull-up assembly 200. The scan driving circuit further comprises a pull-down assembly 400 where the pull-down assembly 400 comprises a twentieth controllable switch T31 and a twenty-first controllable switch T41, and control ends of the twentieth controllable switch T31 and the twenty-first controllable switch T41 are coupled to a next-stage scanning line G (N+2). The reference low-level signal VSS is sent to output ends of the twentieth controllable switch T31 and the twenty-first controllable switch T41, an input end of the twentieth controllable switch T31 is coupled to the current scanning line G(N), and an input end of the twenty-first controllable switch T41 is coupled to the output end Q(N) of the pull-up control assembly 100. When the current scanning line works, the storage capacitor Cb increases a voltage of the output end Q(N) of the pull-up control assembly 100 to turn on the pull-up assembly 200, where the voltage of the output end Q(N) of the pull-up control assembly 100 is same as a voltage of the control end of the pull-up assembly 200. The pull-down assembly 400 is used to reduce voltages of the output end Q(N) of the pull-up control assembly 100 and the current scanning line G(N).

The first pull-down maintaining signal LC1 is sent to a control end and an input end of the third controllable switch T51, and an output end of the third controllable switch T51 is coupled to a control end of the fourth controllable switch T53. The second pull-down maintaining signal LC2 is sent to a control end of the fifth controllable switch T54, the first pull-down maintaining signal LC1 is sent to an input end of the fifth controllable switch T54, and an output end of the fifth controllable switch T54 is coupled to the control end of the second controllable switch T42. The first pull-down maintaining signal LC1 is sent to an input end of the fourth controllable switch T53, and an output end of the fourth controllable switch T53 is coupled to the control end of the controllable switch T42.

The first pull-down maintaining assembly 600 further comprises a first controllable switch T32, where an input end of the first controllable switch T32 is coupled to the current scanning line G(N), the reference low-level signal VSS is sent to an output end of the first controllable switch T32, and a control end of the first controllable switch T32 is coupled to the input end of the repair assembly 20. The control end of the first controllable switch T32 is coupled to the output end of the fourth controllable switch T53 and the control end of the controllable switch T42.

When the first controllable switch T32 and the second controllable switch T42 turn off in the work stage of the current scanning line G (N), the repair assembly 20 turns off. When the first controllable switch T32 and the second controllable switch T42 turn on in the work stage of the current scanning line, the repair assembly 20 turns on. In the work stage of the current scanning line, the reference low-level signal VSS is sent to the repair assembly 20 via the turn-off unit 900, reduces voltages of the control ends of the first controllable switch T32 and the second controllable switch T42 through the repair assembly 20, and turn off the first controllable switch T32 and the second controllable switch T42. In the present disclosure, when the first controllable switch and the second controllable switch cannot normally turn off in the work stage of the current scanning line, the repair assembly 20 turns on to turn off the first controllable switch and the second controllable switch, which makes the GOA circuit normally to work. Thus, current leakage and failure of the GOA because the first controllable switch and the second controllable switch cannot turn off, is avoided.

The pull-down maintaining assembly 10 further comprises a second pull-down maintaining assembly 700, where the second pull-down maintaining assembly 700 comprises a second pull-down maintaining unit 710 and a second pull-down maintaining control unit 720 that drives the second pull-down maintaining unit 710. The second pull-down maintaining unit 710 comprises an eighth controllable switch T33 and a ninth controllable switch T43. The second pull-down maintaining control unit 720 comprises a tenth controllable switch T61, an eleventh controllable switch T63, and a twelfth controllable switch T64.

An input end of the ninth controllable switch T43 is coupled to the output end Q (N) of the pull-up control assembly 100, the reference low-level signal VSS is sent to an output end of the ninth controllable switch T43, and a control end of the ninth controllable switch T43 is coupled to the input end of the repair assembly 20. An input end of the eighth controllable switch T33 is coupled to the current scanning line G (N), the reference low-level signal VSS is sent to an output end of the eighth controllable switch T33, and a control end of the eighth controllable switch T33 is coupled to the input end of the repair assembly 20. The control end of the eighth controllable switch T33 is coupled to an output end of the eleventh controllable switch T63 and the control end of the ninth controllable switch T43. The second pull-down maintaining signal LC2 is sent to a control end and an input end of the tenth controllable switch T61, and an output end of the tenth controllable switch T61 is coupled to a control end of the eleventh controllable switch T63. The first pull-down maintaining signal LC1 is sent to a control end of the twelfth controllable switch T64, the second pull-down maintaining signal LC2 is sent to an input end of the twelfth controllable switch T64, and an output end of the twelfth controllable switch T64 is coupled to the control ends of the eighth controllable switch T33 and the ninth controllable switch T43. The second pull-down maintaining signal LC2 is sent to an input end of the eleventh controllable switch T63, and the output end of the eleventh controllable switch T63 is coupled to the control ends of the eighth controllable switch T33 and the ninth controllable switch T43.

The scan driving circuit further comprises a fifteenth controllable switch T55, where a control end of the fifteenth controllable switch T55 is coupled to the output end Q (N) of the pull-up control assembly, and the fifteenth controllable switch T55 is arranged between the control ends of the first and second controllable switches T32/T42 and the control ends of the eighth and ninth controllable switches T33/T43.

When the first controllable switch T32, the second controllable switch T42, the eighth controllable switch T33, and the ninth controllable switch T43 turn off in the work stage of the current scanning line G (N), the repair assembly 20 turns off. When the first controllable switch T32, the second controllable switch T42, the eighth controllable switch T33, and the ninth controllable switch T43 turn on in the work stage of the current scanning line because one or more of the fifth controllable switch T54, the twelfth controllable switch T64, and the fifteenth controllable switch T55 do not work, the repair assembly 20 turns on. In the work stage of the current scanning line, the reference low-level signal is sent to the repair assembly 20 via the turn-off unit 900, reduces voltages of the control ends of the first controllable switch T32, the second controllable switch T42, the eighth controllable switch T33, and the ninth controllable switch T43 through the repair assembly 20 to turn off the first controllable switch T32, the second controllable switch T42, the eighth controllable switch T33, and the ninth controllable switch T43. In the present disclosure, when the eighth controllable switch T33 and the ninth controllable switch T43 cannot normally turn off in the work stage of the current scanning line, the repair assembly 20 turns on to turn off the eighth controllable switch T33 and the ninth controllable switch T43, which makes the GOA circuit to normally work. Thus, current leakage and failure of the GOA circuit because the eighth controllable switch T33 and the ninth controllable switch T43 cannot turn off, is avoided.

In the present disclosure, the first pull-down maintaining assembly 600 and the second pull-down maintaining assembly 700 are arranged in interlock, the fifteenth controllable switch can make the pull-down maintaining assembly turn off in time in the work stage of the current scanning line G (N), which avoids the current leakage of the GOA circuit because the pull-down maintaining assembly cannot turn off in time. Taking an example as follows: when the first pull-down maintaining signal LC1 is at high level (logic 1) in an non-work stage of the current scanning line, and when the second pull-down maintaining signal LC2 is at low level in the non-work stage of the current scanning line, the first pull-down maintaining assembly 600 work, and the second pull-down maintaining assembly 700 does not work. At this time, the control ends of the first controllable switch T32 and the second controllable switch T42 are at the high level to turn on, and the control ends of the eighth controllable switch T33 and the ninth controllable switch T43 are at the low level to turn off. If the current scanning line starts to work at this time, the fifteenth controllable switch T55 turns on, the low levels of the control ends of the eighth controllable switch T33 and the ninth controllable switch T43 decrease electric potentials of the control ends of the first controllable switch T32 and the second controllable switch T42 through the fifteenth controllable switch T55 to turn off the first controllable switch T32 and the second controllable switch T42, and vice versa. The first pull-down maintaining assembly 600 and the second pull-down maintaining assembly 700 are in an interlock state through interaction of the first pull-down maintaining signal LC1 and the second pull-down maintaining signal LC2. Thus, the pull-down maintaining assembly can turn off in the work stage of the current scanning line, and the current leakage of the GOA circuit is avoided.

In the example, the logical operation of the first pull-down maintaining signal LC1 is opposite to the logical operation of the second pull-down maintaining signal LC2, and the first pull-down maintaining assembly and the second pull-down maintaining assembly are in interlock state, thus, periods of the first pull-down maintaining signal LC1 and the second pull-down maintaining signal LC2 are not limited. Fluctuations of a response time and the electric potential exist in a switching process of the assemblies, which slightly affects the work of the current scanning line. Thus, in the present disclosure, the first pull-down maintaining signal LC1 having a low frequency and the second pull-down maintaining signal LC2 having the low frequency are used, and time of switching of the first pull-down maintaining signal LC1 and the second pull-down maintaining signal LC2 is a blanking time between each frame image. In a typical GOA circuit, a potential difference Vgs between the control end of the first controllable switch T32 and the output end of the first controllable switch T32, a potential difference Vgs between the control end of the second controllable switch T42 and the output end of the second controllable switch T42, a potential difference Vgs between the control end of the eighth controllable switch T33 and the output end of the eighth controllable switch T33, and a potential difference Vgs between the control end of the ninth controllable switch T43 and the output end of the ninth controllable switch T43 are often greater than zero due to reasons, such as charge accumulation, which makes the controllable switch be in a unstable state, thus, the current leakage is caused, which causes the electric potentials of the output end Q(N) of the pull-up control assembly 100 and the current scanning line G (N) to be affected, and output of the GOA circuit to be further affected. Thus, in the example, the electric potentials of the first pull-down maintaining signal LC1 having the low frequency and the second pull-down maintaining signal LC2 having the low frequency are less than the reference low-level signal VSS, thus, the potential difference Vgs is less than zero, which makes the first controllable switch T32, the second controllable switch T42, the eighth controllable switch T33, and the ninth controllable switch T43 be in the non-work stage, thereby avoiding the current leakage of the GOA circuit.

The turn-off unit 900 comprises a sixth controllable switch T52 and a thirteenth controllable switch T62. Control ends of the sixth controllable switch T52 and the thirteenth controllable switch T62 are coupled to the output end of the pull-up control assembly. The reference low-level signal VSS is sent to output ends of the sixth controllable switch T52 and the thirteenth controllable switch T62, an input end of the six controllable switch T52 is coupled to the control ends of the first controllable switch T32 and the second controllable switch T42, and an input end of the thirteenth controllable switch T62 is coupled to the control ends of the eighth controllable switch T33 and the ninth controllable switch T43. The sixth controllable switch T52 and the thirteenth controllable switch T62 can be used to reduce electric potential of the output end Q (N) of the pull-up control assembly.

In the present disclosure, the scan driving circuit having single pull-down maintaining assembly also can avoid the current leakage of the GOA circuit.

Figure 3:
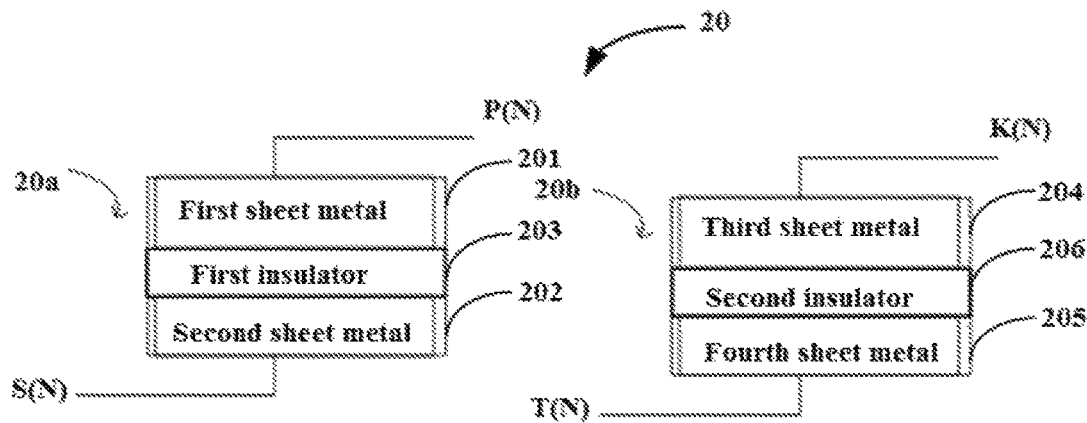
FIG. 3 is a partial structural diagram of FIG. 2.

FIG. 3 is a partial structural diagram of FIG. 2, combined with FIG. 1, the repair assembly 20 comprises a first connecting unit 20a and a second connecting unit 20b. The first connecting unit 20a comprises a first sheet metal 201, a second sheet metal 202, and a first insulator 203. The second connecting unit 20b comprises a third sheet metal 204, a fourth sheet metal 205, and a second insulator 206. The first insulator 203 is arranged between the first sheet metal 201 and the second sheet metal 202, and the second insulator 206 is arranged between the third sheet metal 204 and the fourth sheet metal 205. The first sheet metal 201 is coupled to the control ends of the first controllable switch T32 and the second controllable switch T42, the reference low-level signal VSS is sent to the second sheet metal 202 through the sixth controllable switch T52, the third sheet metal 204 is coupled to the control ends of the eighth controllable switch T33 and the ninth controllable switch T43, and the reference low-level signal VSS is sent to the fourth sheet metal 205 through the thirteenth controllable switch T62.

When the first controllable switch T32, the second controllable switch T42, the eighth controllable switch T33, and the ninth controllable switch T43 turn on in the work stage of the current scanning line because one or more of the fifth controllable switch T54, the twelfth controllable switch T64, and the fifteenth controllable switch T55 do not work, and insulation function of the first insulator 203 and the second insulator 206 are failure, thus, the first sheet metal 201 is connected with the second sheet metal 202, and the third sheet metal 204 is connected with the fourth sheet metal 205. In the work stage of the current scanning line, the reference low-level signal VSS is sent to the repair assembly 20 via the sixth controllable switch T52 and the thirteenth controllable switch T62, and reduces the voltages of the control ends of the first controllable switch T32, the second controllable switch T42, the eighth controllable switch T33, and the ninth controllable switch T43 through the repair assembly 20 to turn off the first controllable switch T32, the second controllable switch T42, the eighth controllable switch T33, and the ninth controllable switch T43. In the present disclosure, structures of the first connecting unit 20a and the second connecting unit 20b are easy to repair each of fault points. Taking the first connecting unit 20a as an example, when the first controllable switch T32 and the second controllable switch T42 turn off in the work stage of the current scanning line G (N), electric potentials of the first sheet metal 201 and the second sheet metal 202 are same in the work stage of the current scanning line, thus, the insulation function of the first insulator 203 is effective. When the first controllable switch T32 and the second controllable switch T42 turn on in the work stage of the current scanning line, the insulation function of the first insulator 203 is failure using radium irradiation method, and the first sheet metal 201 and the second sheet metal 202 are connected to each other. Thus, the reference low-level signal VSS can reduce the voltages of the control ends of the first controllable switch T32 and the second controllable switch T42 through the sixth controllable switch T52 and the first connecting unit 20a to turn off the first controllable switch T32 and the second controllable switch T42, which makes the GOA circuit to normally work, thereby avoiding influence of the output of the GOA circuit due to the current leakage of the GOA circuit, and failure of the GOA circuit due to failure of some TFTs. Thus, the product yield is improved.

Figure 4:
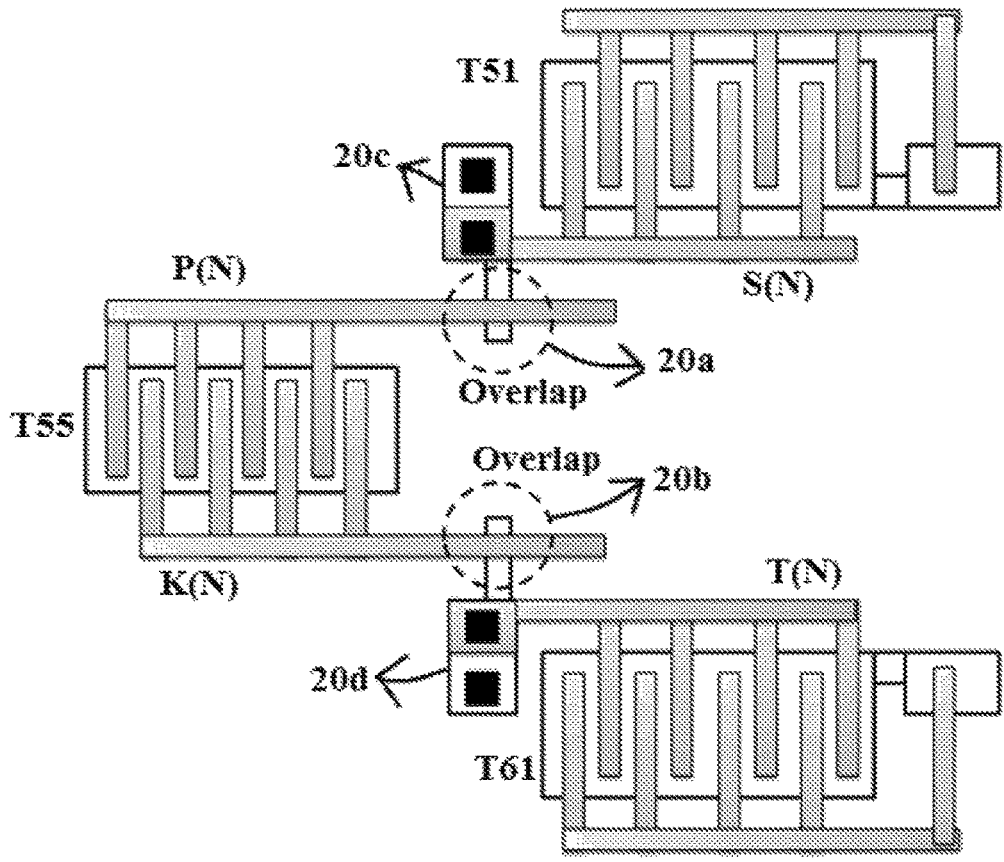
FIG. 4 is a partial structural diagram of FIG. 2 and FIG. 3.

FIG. 4 is a partial structural diagram of FIG. 2 and FIG. 3. According to FIG. 2 and FIG. 3, the scan driving circuit comprises a first wire P (N), a second wire K (N), a third wire S (N), and a fourth wire T (N). The repair assembly 20 further comprises a first via hole unit 20c and a second via hole unit 20d, where a first end of the first via hole unit 20c is coupled to the third wire S (N), and a second end of the first via hole unit 20c is coupled to the first wire P (N) through the first connecting unit 20a. A first end of the second via hole unit 20d is coupled to the fourth wire T (N), and a second end of the second via hole unit 20d is coupled to the second wire K (N) through the second connecting unit 20b. The third wire S (N) is coupled to the control end of the fourth controllable switch T53, and the reference low-level signal VSS is sent to the third wire S(N) through the sixth controllable switch T52. The fourth wire T (N) is coupled to the control end of the eleventh controllable switch T63, and the reference low-level signal VSS is sent to the fourth wire T (N) through the thirteenth controllable switch T62. The first wire P (N) is coupled to the control ends of the first controllable switch T32 and the second controllable switch T42, and is coupled to the fifteenth controllable switch T55. The second wire K (N) is coupled to the control ends of the eighth controllable switch T33 and the ninth controllable switch T43, and is coupled to the fifteenth controllable switch T55.

The first via hole unit 20c connects the first wire with the third wire, where a layer configured with the first wire is different with a layer configured with the third wire. And the second via hole unit 20d connects the second wire with the fourth wire, where a layer configured with the second wire is different with a layer configured with the fourth wire.

Figure 5:
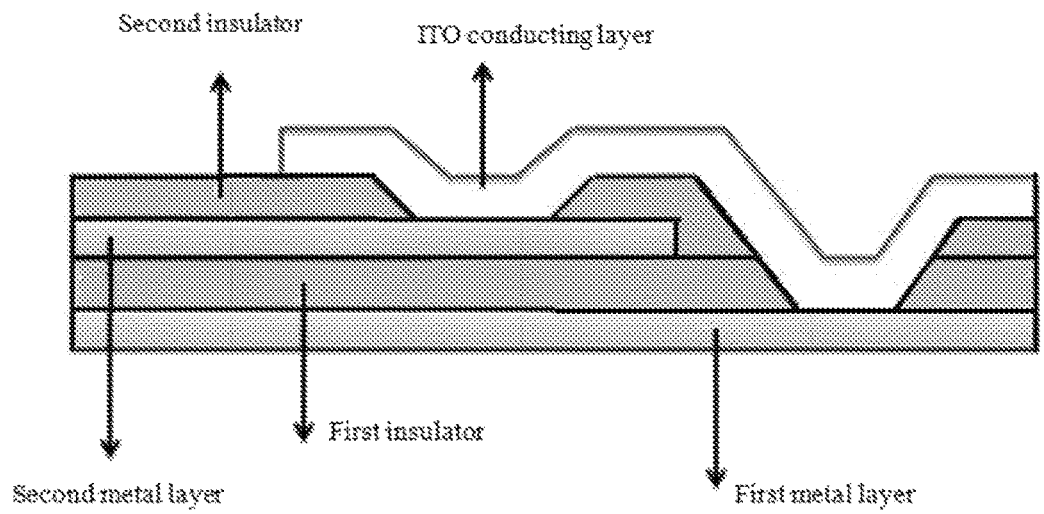
FIG. 5 is a partial structural diagram of a first example of the present disclosure.

FIG. 5 is a partial structural diagram of the first example, and is a structural diagram of the first via hole units and the second via hole unit. Structure of the first via hole unit is a same as structure of the second via hole unit, where a first metal layer is the layer configured with the first wire and the layer configured with the second wire, and a second metal layer is the layer configured with the third wire and the layer configured with the fourth wire position. An insulating layer is arranged between the first metal layer and the second metal layer, a conducting indium tin oxide (ITO) layer connects the first wire with the third wire, and connects the second wire with the fourth wire.

Example 2

Figure 6:
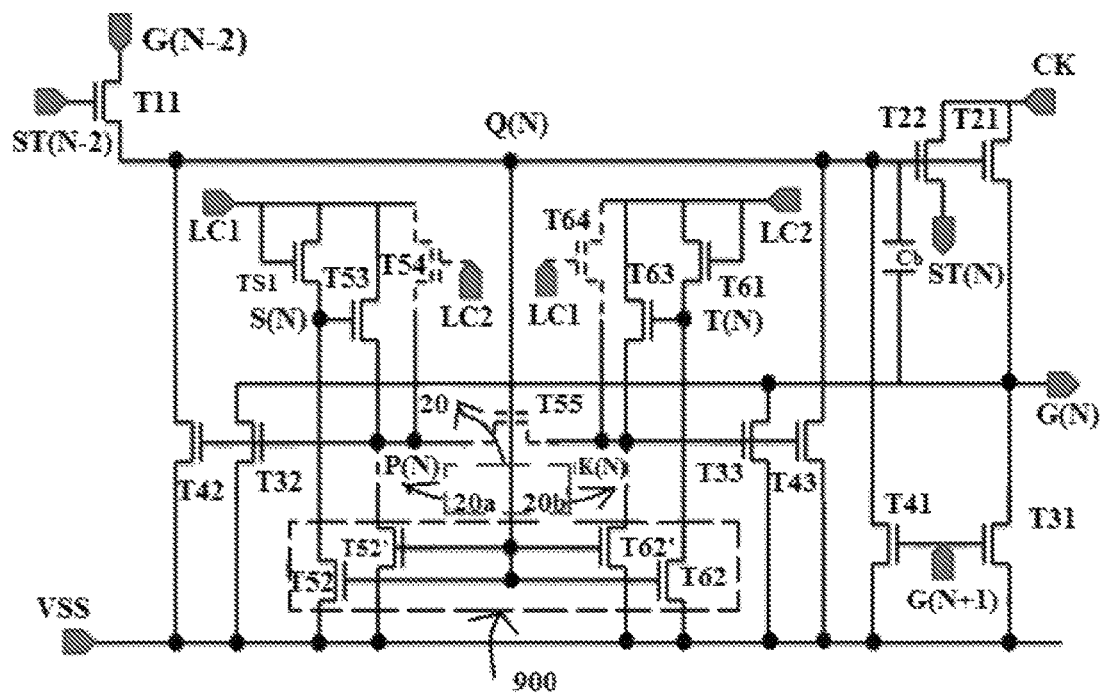
FIG. 6 is a schematic diagram of a second example of the present disclosure.

FIG. 6 is a schematic diagram of a second example of the present disclosure, and the second example improves according to the first example. Some differences are between the first example and the second example: the turn-off unit 900 comprises the sixth controllable switch T52, the thirteenth controllable switch T62, a twenty-second controllable switch T52', and a twenty-third controllable switch T62'. Control ends of the sixth controllable switch T52, the thirteenth controllable switch T62, the twenty-second controllable switch T52', and the twenty-third controllable switch T62' are coupled to the output end of the pull-up control assembly. The reference low-level signal VSS is sent to output ends of the sixth controllable switch T52, the thirteenth controllable switch T62, the twenty-second controllable switch T52', and the twenty-third controllable switch T62'. An input end of the twenty-second controllable switch T52' is coupled to the control ends of the first controllable switch T32 and the second controllable switch T42, the input end of the sixth controllable switch T52 is coupled to the output end of the third controllable switch T51 and the control end of the fourth controllable switch T53, an input end of the twenty-third controllable switch T62' is coupled to the control ends of the eighth controllable switch T33 and the ninth controllable switch T43, and the input end of the thirteenth controllable switch T62 is coupled to the output end of the tenth controllable switch T61 and the control end of the eleventh controllable switch T63.

The repair assembly 20 comprises the first connecting unit 20a and the second connecting unit 20b. The first connecting unit 20a comprises the first sheet metal 201, the second sheet metal 202, and the first insulator 203. The second connecting unit 20b comprises the third sheet metal 204, the fourth sheet metal 205, and the second insulator 206. The first insulator 203 is arranged between the first sheet metal 201 and the second sheet metal 202, the second insulator 206 is arranged between the third sheet metal 204 and the fourth sheet metal 205, the first sheet metal 201 is coupled to the control ends of the first controllable switch T32 and the second controllable switch T42, the reference low-level signal VSS is sent to the second sheet metal 202 through the twenty-second controllable switch T52', the third sheet metal 204 is coupled to the control ends of the eighth controllable switch T33 and the ninth controllable switch T43, and the reference low-level signal VSS is sent to the fourth sheet metal 205 through the twenty-third controllable switch T62'.

When the first controllable switch T32, the second controllable switch T42, the eighth controllable switch T33, and the ninth controllable switch T43 turn on in the work stage of the current scanning line because one or some of the fifth controllable switch T54, the twelfth controllable switch T64, and the fifteenth controllable switch T55 do not work, the breakdowns of the first insulator 203 and the second insulator 206 are caused, thus, the first sheet metal 201 and the second sheet metal 202 are short-circuited, and the third sheet metal 204 and the fourth sheet metal 205 are short-circuited. In the work stage of the current scanning line G(N), the reference low-level signal VSS is sent to the control ends of the first controllable switch T32, the second controllable switch T42, the eighth controllable switch T33, and the ninth controllable switch T43 via the twenty-second controllable switch T52' and the twenty-third controllable switch T62', and reduces the voltages of the control ends of the first controllable switch T32, the second controllable switch T42, the eighth controllable switch T33, and the ninth controllable switch T43 through the repair assembly 20 to turn off the first controllable switch T32, the second controllable switch T42, the eighth controllable switch T33, and the ninth controllable switch T43.

Figure 7:
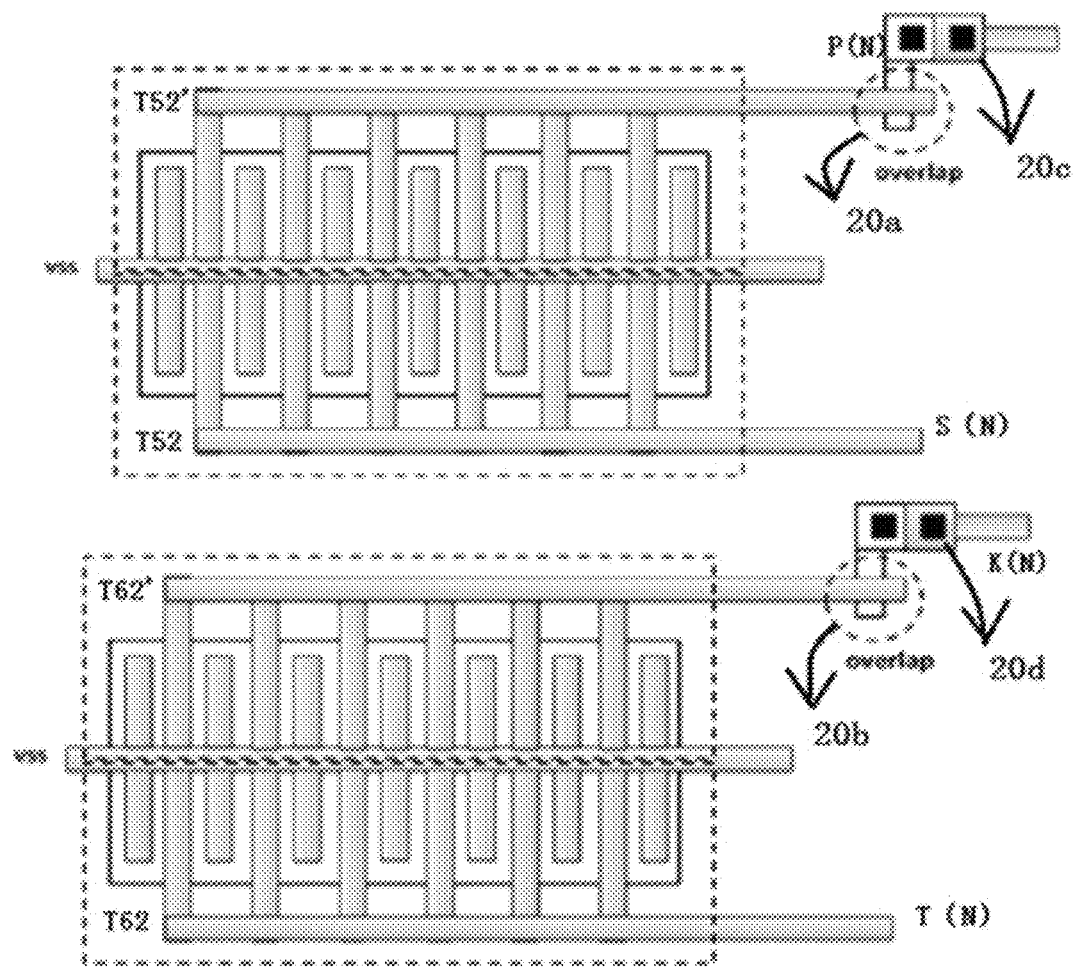
FIG. 7 is a partial structural diagram of a second example of the present disclosure.

FIG. 7 is a partial structural diagram of the second example, combined with FIG. 6, the scan driving circuit comprises the first wire P (N) and the second wire K (N). The repair assembly 20 further comprises the first via hole unit 20c and the second via hole unit 20d. A first end of the first connecting unit 20a is coupled to the first wire P (N) through the first via hole unit 20c, and the reference low-level signal VSS is sent to a second end of the first connecting unit 20a via the twenty-second controllable switch T52'. A first end of the second connecting unit 20b is coupled to the second wire K (N) through the second via hole unit 20d, and the reference low-level signal VSS is sent to a second end of the second connecting unit 20b via the twenty-third controllable switch T62'. The first wire P (N) is coupled to the control ends of the first controllable switch T32 and the second controllable switch T42, and is coupled to the fifteenth controllable switch T55. The second wire K (N) is coupled to the control ends of the eighth controllable switch T33 and the ninth controllable switch T43, and is coupled to the fifteenth controllable switch T55.

Example 3

Figure 8:
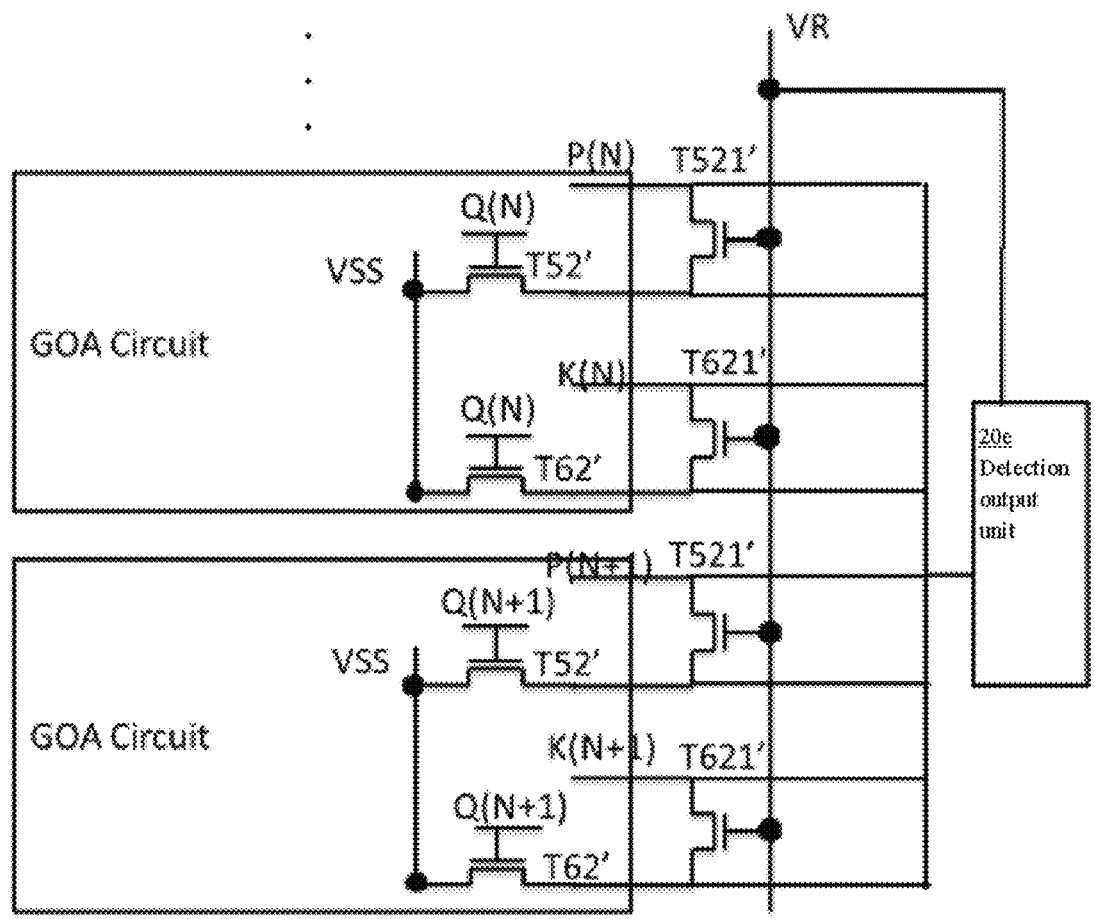
FIG. 8 is a schematic diagram of a third example of the present disclosure.

FIG. 8 is a schematic diagram of a third example of the present disclosure, and the third example improves according to the second example. Some differences are between the second example and the third example: the repair assembly 20 comprises a detection output unit 20e and a repair line VR. The turn-off unit 900 comprises the sixth controllable switch T52, the thirteenth controllable switch T62, the twenty-second controllable switch T52', the twenty-third controllable switch T62', the twenty-fourth controllable switch T521', and the twenty-fifth controllable switch T621'. The control ends of the sixth controllable switch T52 and the thirteenth controllable switch T62 are coupled to the output end Q (N) of the pull-up control assembly 100, the reference low-level signal VSS is sent to the output ends of the sixth controllable switch T52 and the thirteenth controllable switch T62, the input end of the six controllable switch T52 is coupled to the control ends of the first controllable switch T32 and the second controllable switch T42, and the input end of the thirteenth controllable switch T62 is coupled to the control ends of the eighth controllable switch T33 and the ninth controllable switch T43.

The control ends of the twenty-second controllable switch T52' and the twenty-third controllable switch T62' are coupled to the output end Q (N) of the pull-up control assembly 100, and the reference low-level signal VSS is sent to the output ends of the twenty-second controllable switch T52' and the twenty-third controllable switch T62'. Control ends of the twenty-fourth controllable switch T521' and the twenty-fifth controllable switch T621' are coupled to the repair line VR, an input end of the twenty-fourth controllable switch T521' is coupled to the control ends of the first controllable switch T32 and the second controllable switch T42, and an output end of the twenty-fourth controllable switch T521' is coupled to the input end of the twenty-second controllable switch T52'. An input end of the twenty-fifth controllable switch T621' is coupled to the control ends of the eighth controllable switch T33 and the ninth controllable switch T43, and an output end of the twenty-fifth controllable switch T621' is coupled to the input end of the twenty-third controllable switch T62'.

A first end of the detection output unit 20e is coupled to the control ends of the first controllable switch T32 and the second controllable switch T42, and the control ends of the eighth controllable switch T33 and the ninth controllable switch T43. A second end of the detection output unit 20e is coupled to the repair line VR.

When the first controllable switch T32, the second controllable switch T42, the eighth controllable switch T33, and the ninth controllable switch T43 turn off in the work stage of the current scanning line G (N), the detection output unit 20e outputs a low level signal to the repair line VR, and the repair line VR controls the twenty-second controllable switch T52', the twenty-third controllable switch T62', the twenty-fourth controllable switch T521', and the twenty-fifth controllable switch T621' to turn off.

When the first controllable switch T32, the second controllable switch T42, the eighth controllable switch T33, and the ninth controllable switch T43 turn on in the work stage of the current scanning line because one or more of the fifth controllable switch T54, the twelfth controllable switch T64, and the fifteenth controllable switch T55 do not work, the detection output unit 20e outputs a high level signal to the repair line VR, and the repair line VR controls the twenty-second controllable switch T52', the twenty-third controllable switch T62', the twenty-fourth controllable switch T521', and the twenty-fifth controllable switch T621' to turn on. Because the high level of the output end Q (N) of the pull-up control assembly 100 controls the sixth controllable switch T52 and the thirteenth controllable switch T62 to turn on, the reference low-level signal VSS reduces the electric potentials of the control ends of the first controllable switch T32, the second controllable switch T42, the eighth controllable switch T33, and the ninth controllable switch T43 through the twenty-second controllable switch T52', the twenty-third controllable switch T62', the twenty-fourth controllable switch T521', and the twenty-fifth controllable switch T621', and controls the first controllable switch T32, the second controllable switch T42, the eighth controllable switch T33, and the ninth controllable switch T43 to turn off.

In the present disclosure, at least two groups of above-mentioned scan driving circuits are arranged. The first end of the detection output unit 20e is coupled to the control ends of the first and second controllable switch T32/T42 of each of the above-mentioned scan driving circuits, and the control ends of the eighth and ninth controllable switch T33/T43 of each of the above-mentioned scan driving circuits. The second end of the detection output unit 20e is coupled to the repair line VR.

When the detection output unit 20e detects that anyone or more of the first controllable switch T32, the second controllable switch T42, the eighth controllable switch T33, and the ninth controllable switch T43 of each of the scan driving circuits are at the high level in the work stage of the current scanning line, and turn on, the detection output unit 20e irreversibly outputs the high level signal to the repair line VR, and the repair line VR controls the first controllable switch T32, the second controllable switch T42, the eighth controllable switch T33, and the ninth controllable switch T43 of each of the scan driving circuits to turn off in the work stage of the current scanning line.

In the non-work stage of the current scanning line, the sixth controllable switch T52 and the thirteenth controllable switch T62 turn off, and the repair assembly 20 does not reduce the electric potential of the control end of the pull-down maintaining unit of each of the scan driving circuits. Thus, when the scan driving circuits have breakdown, the repair assembly 20 can fix the scan driving circuit having the breakdown to work, and functions of the pull-down maintaining units of other normal scan driving circuits are improved.

Example 4

Figure 9:
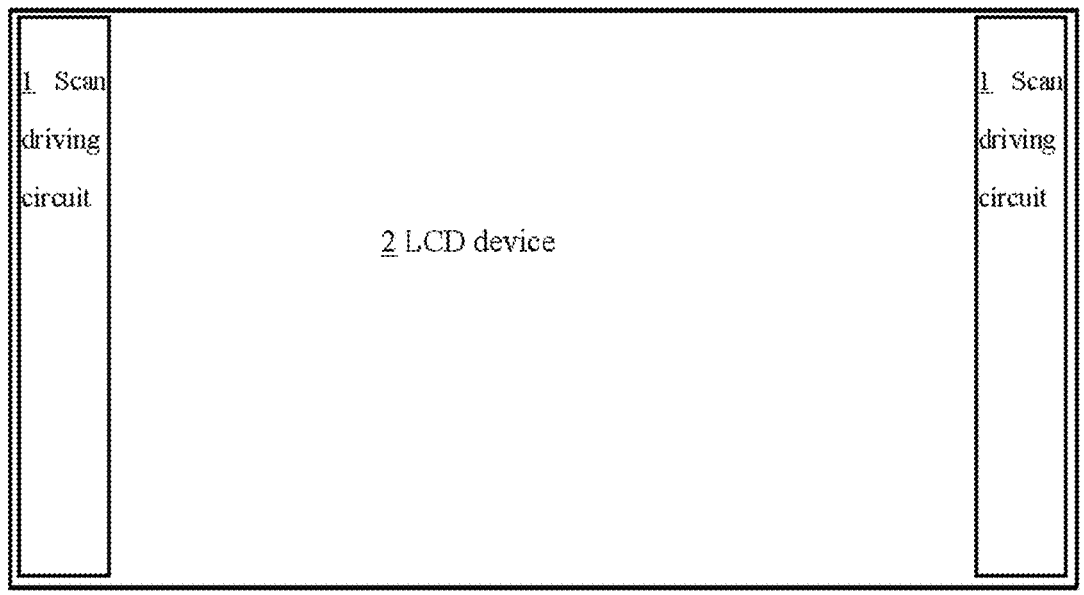
FIG. 9 is a schematic diagram of a liquid crystal display (LCD) device of the present disclosure.

FIG. 9 is a schematic diagram of a liquid crystal display (LCD) device of the present disclosure. The LCD device 2 comprises the scan driving circuit 1 arranged on two ends of the LCD device 2, where the scan driving circuit 1 is any one of the scan driving circuits of the present disclosure.

The present disclosure is described in detail in accordance with the above contents with the specific exemplary examples. However, this present disclosure is not limited to the specific examples. For the ordinary technical personnel of the technical field of the present disclosure, on the premise of keeping the conception of, the technical personnel can also make simple deductions or replacements, and all of which should be considered to belong to the protection scope of the present disclosure.

I claim:

1. A scan driving circuit, comprising:
a repair assembly;
a pull-up assembly;
a pull-up control assembly that drives the pull-up assembly;
a pull-down maintaining assembly;
a reference low-level signal; and
a turn-off unit;

wherein an output end of the pull-up assembly is coupled to a current scanning line, a clock scanning signal is sent to an input end of the pull-up assembly, and a control end of the pull-up assembly is coupled to an output end of the pull-up control assembly;
a pull-up control signal is sent to a control end of the pull-up control assembly, and the reference low-level signal is sent to the output end of the pull-up control assembly and the current scanning line through the pull-down maintaining assembly;
an input end of the pull-down maintaining assembly is coupled to the output end of the pull-up control assembly, and the reference low-level signal is sent to an output end of the pull-down maintaining assembly;
an input end of the turn-off unit is coupled to the output end of the pull-down maintaining assembly, a control end of the turn-off unit is coupled to the output end of the pull-up control assembly, and the reference low-level signal is sent to an output end of the turn-off unit;
an input end of the repair assembly is coupled to the output end of the pull-down maintaining assembly, the reference low-level signal is sent to an output end of the repair assembly through the turn-off unit, and a control end of the repair assembly is coupled to the output end of the pull-up control assembly;
when the pull-down maintaining assembly turns off in a work stage of the current scanning line, the repair assembly turns off; when the pull-down maintaining assembly turns on in the work stage of the current scanning line, the repair assembly is connected with the pull-down maintaining assembly; in the work stage of the current scanning line, the reference low-level signal is sent to the repair assembly via the turn-off unit, and turns off the pull-down maintaining assembly through the repair assembly.

2. The scan driving circuit of claim 1, further comprising a first pull-down maintaining signal and a second pull-down maintaining signal; wherein logical operation of the first pull-down maintaining signal is opposite to logical operation of the second pull-down maintaining signal;
wherein the pull-down maintaining assembly comprises a first pull-down maintaining assembly; the first pull-down maintaining assembly comprises a first pull-down maintaining unit and a first pull-down maintaining control unit that drives the first pull-down maintaining unit; the first pull-down maintaining unit comprises a first controllable switch and a second controllable switch; the first pull-down maintaining control unit comprises a third controllable switch, a fourth controllable switch, and a fifth controllable switch; an input end of the second controllable switch is coupled to the output end of the pull-up control assembly, the reference low-level signal is sent to an output end of the second controllable switch, and a control end of the second controllable switch is coupled to the input end of the repair assembly;
the first pull-down maintaining signal is sent to a control end and an input end of the third controllable switch, and an output end of the third controllable switch is coupled to a control end of the fourth controllable switch; the second pull-down maintaining signal is sent to a control end of the fifth controllable switch, the first pull-down maintaining signal is sent to an input end of the fifth controllable switch, and an output end of the fifth controllable switch is coupled to the control end of the second controllable switch; the first pull-down maintaining signal is sent to an input end of the fourth controllable switch, and an output end of the fourth controllable switch is coupled to the control end of the second controllable switch;

when the second controllable switch turns off in the work stage of the current scanning line, the repair assembly turns off; when the second controllable switch turns on in the work stage of the current scanning line, the repair assembly turns on; in the work stage of the current scanning line, the reference low-level signal is sent to the repair assembly via the turn-off unit, and reduces electric potential of the control end of the second controllable switch through the repair assembly to turn off the second controllable switch.

3. The scan driving circuit of claim 2, wherein an input end of the first controllable switch is coupled to the current scanning line, the reference low-level signal is sent to an output end of the first controllable switch, and a control end of the first controllable switch is coupled to the input end of the repair assembly; the control end of the first controllable switch is coupled to the output end of the fourth controllable switch and the control end of the second controllable switch;

when the first and the second controllable switches turn off in the work stage of the current scanning line, the repair assembly turns off; when the first and the second controllable switches turn on in the work stage of the current scanning line, the repair assembly turn on; in the work stage of the current scanning line, the reference low-level signal is sent to the repair assembly via the turn-off unit, and reduces electric potentials of the control ends of the first and the second controllable switches through the repair assembly to turn off the first and the second controllable switches.

4. The scan driving circuit of claim 3, wherein the pull-down maintaining assembly further comprises a second pull-down maintaining assembly; the second pull-down maintaining assembly comprises a second pull-down maintaining unit and a second pull-down maintaining control unit that drives the second pull-down maintaining unit; the turn-off unit comprises a sixth controllable switch and a thirteenth controllable switch; the second pull-down maintaining unit comprises an eighth controllable switch and a ninth controllable switch; the second pull-down maintaining control unit comprises a tenth controllable switch, an eleventh controllable switch, and a twelfth controllable switch;

wherein an input end of the ninth controllable switch is couple to the output end of the pull-up control assembly, the reference low-level signal is sent to an output end of the ninth controllable switch, and a control end of the ninth controllable switch is coupled to the input end of the repair assembly;

wherein an input end of the eighth controllable switch is coupled to the current scanning line, the reference low-level signal is sent to an output end of the eighth controllable switch, and a control end of the eighth controllable switch is coupled to the input end of the repair assembly; the control end of the eighth controllable switch is coupled to an output end of the eleventh controllable switch and the control end of the second controllable switch;

wherein the second pull-down maintaining signal is sent to a control end and an input end of the tenth controllable switch, and an output end of the tenth controllable switch is coupled to a control end of the eleventh controllable switch; the first pull-down maintaining signal is sent to a control end of the twelfth controllable switch, the second pull-down maintaining signal is sent to an input end of the twelfth controllable switch, and an output end of the twelfth controllable switch is coupled to the control ends of the eighth and the ninth controllable switches; the second pull-down maintaining signal is sent to an input end of the eleventh controllable switch, and the output end of the eleventh controllable switch is coupled to the control ends of the eighth and the ninth controllable switches;

when the first controllable switch, the second controllable switch, the eighth controllable switch, and the ninth controllable switch turn off in the work stage of the current scanning line, the repair assembly turns off; when the first controllable switch, the second controllable switch, the eighth controllable switch, and the ninth controllable switch turn on in the work stage of the current scanning line, the repair assembly turns on; in the work stage of the current scanning line, the reference low-level signal is sent to the repair assembly via the turn-off unit, and reduces electric potentials of the control ends of the first controllable switch, the second controllable switch, the eighth controllable switch, and the ninth controllable switch through the repair assembly to turn off the first controllable switch, the second controllable switch, the eighth controllable switch, and the ninth controllable switch.

5. The scan driving circuit of claim 4, further comprising: a fifteenth controllable switch; wherein a control end of the fifteenth controllable switch is coupled to the output end of the pull-up control assembly, and the fifteenth controllable switch is arranged between the control ends of the first and the second controllable switches and the control ends of the eighth and the ninth controllable switches;

when the first controllable switch, the second controllable switch, the eighth controllable switch, and the ninth controllable switch turn off in the work stage of the current scanning line, the repair assembly turns off; when the first controllable switch, the second controllable switch, the eighth controllable switch, and the ninth controllable switch turn on in the work stage of the current scanning line because one or more of the fifth controllable switch, the twelfth controllable switch, and the fifteenth controllable switch do not work, the repair assembly turns on; in the work stage of the current scanning line, the reference low-level signal is sent to the repair assembly via the turn-off unit, and reduces electric potentials of the control ends of the first controllable switch, the second controllable switch, the eighth controllable switch, and the ninth controllable switch through the repair assembly to turn off the first controllable switch, the second controllable switch, the eighth controllable switch, and the ninth controllable switch.

6. The scan driving circuit of claim 5, wherein control ends of the sixth controllable switch and the thirteenth controllable switch are coupled to the output end of the pull-up control assembly, the reference low-level signal is sent to output ends of the sixth controllable switch and the thirteenth controllable switch, an input end of the six controllable switch is coupled to the control ends of the first controllable switch and the second controllable switch, and an input end of the thirteenth controllable switch is coupled to the control ends of the eighth controllable switch and the ninth controllable switch;

wherein the repair assembly comprises a first connecting unit and a second connecting unit; the first connecting unit comprises a first sheet metal, a second sheet metal, and a first insulator; the second connecting unit comprises a third sheet metal, a fourth sheet metal, and a second insulator; the first insulator is arranged between the first sheet metal and the second sheet metal, the second insulator is arranged between the third sheet metal and the fourth sheet metal; the first sheet metal is coupled to the control ends of the first controllable switch and the second controllable switch, and the reference low-level signal is sent to the second sheet metal through the sixth controllable switch; the third sheet metal is coupled to the control ends of the eighth controllable switch and the ninth controllable switch, and the reference low-level signal is sent to the fourth sheet metal through the thirteenth controllable switch;

when the first controllable switch, the second controllable switch, the eighth controllable switch, and the ninth controllable switch turn on in the work stage of the current scanning line because one or more of the fifth controllable switch do not work, insulation function of the first insulator and the second insulator are failure, the first sheet metal is connected with the second sheet metal, and the third sheet metal is connected with the fourth sheet metal; in the work stage of the current scanning line, the reference low-level signal is sent to the repair assembly via the sixth controllable switch and the thirteenth controllable switch, and reduces the electric potentials of the control ends of the first controllable switch, the second controllable switch, the eighth controllable switch, and the ninth controllable switch through the repair assembly to turn off the first controllable switch, the second controllable switch, the eighth controllable switch, and the ninth controllable switch.

7. The scan driving circuit of claim 6, further comprising: a first wire, a second wire, a third wire, and a fourth wire;

wherein the repair assembly further comprises a first via hole unit and a second via hole unit; a first end of the first via hole unit is coupled to the third wire, and a second end of the first via hole unit is coupled to the first wire through the first connecting unit; a first end of the second via hole unit is coupled to the fourth wire, and a second end of the second via hole unit is coupled to the second wire through the second connecting unit; the third wire is coupled to the control end of the fourth controllable switch, and the reference low-level signal is sent to the third wire through the sixth controllable switch; the fourth wire is coupled to the control end of the eleventh controllable switch, and the reference low-level signal is sent to the fourth wire through the thirteenth controllable switch; the first wire is coupled to the control ends of the first controllable switch and the second controllable switch, and is coupled to the fifteenth controllable switch; the second wire is coupled to the control ends of the eighth controllable switch and the ninth controllable switch, and is coupled to the fifteenth controllable switch.

8. The scan driving circuit of claim 5, wherein the turn-off unit comprises a twenty-second controllable switch, and a twenty-third controllable switch; control ends of the sixth controllable switch, the thirteenth controllable switch, the twenty-second controllable switch, and the twenty-third controllable switch are coupled to the output end of the pull-up control assembly; the reference low-level signal is sent to output ends of the sixth controllable switch, the thirteenth controllable switch, the twenty-second controllable switch, and the twenty-third controllable switch; an input end of the twenty-second controllable switch is coupled to the control ends of the first controllable switch and the second controllable switch, an input end of the sixth controllable switch is coupled to the control end of the fourth controllable switch, an input end of the twenty-third controllable switch is coupled to the control ends of the eighth controllable switch and the ninth controllable switch, and an input end of the thirteenth controllable switch is coupled to the control end of the eleventh controllable switch;

wherein the repair assembly comprises a first connecting unit and a second connecting unit; the first connecting unit comprises a first sheet metal, a second sheet metal, and a first insulator; the second connecting unit comprises a third sheet metal, a fourth sheet metal, and a second insulator; the first insulator is arranged between the first sheet metal and the second sheet metal, the second insulator is arranged between the third sheet metal and the fourth sheet metal; the first sheet metal is coupled to the control ends of the first controllable switch and the second controllable switch, and the reference low-level signal is sent to the second sheet metal through the twenty-second controllable switch; the third sheet metal is coupled to the control ends of the eighth controllable switch and the ninth controllable switch, and the reference low-level signal is sent to the fourth sheet metal through the twenty-third controllable switch;

when the first controllable switch, the second controllable switch, the eighth controllable switch, and the ninth controllable switch turn on in the work stage of the current scanning line because one or more of the fifth controllable switch, the twelfth controllable switch, and the fifteenth controllable switch do not work, insulation function of the first insulator and the second insulator are in failure, the first sheet metal is connected with the second sheet metal, and the third sheet metal is connected with the fourth sheet metal; in the work stage of the current scanning line, the reference low-level signal is sent to the repair assembly via the twenty-second and twenty-third controllable switches, and reduces the electric potentials of the control ends of the first controllable switch, the second controllable switch, the eighth controllable switch, and the ninth controllable switch through the repair assembly to turn off the first controllable switch, the second controllable switch, the eighth controllable switch, and the ninth controllable switch.

9. The scan driving circuit of claim 8, further comprising: a first wire and a second wire;

wherein the repair assembly further comprises a first via hole unit and a second via hole unit; a first end of the first connecting unit is coupled to the first wire through the first via hole unit, and the reference low-level signal is sent to a second end of the first connecting unit through the twenty-second controllable switch; a first end of the second connecting unit is coupled to the second wire through the second via hole unit, and the reference low-level signal is sent to a second end of the second connecting unit through the twenty-third controllable switch; the first wire is coupled to the control ends of the first controllable switch and the second controllable switch, and is coupled to the fifteenth controllable switch; the second wire is coupled to the control ends of the eighth controllable switch and the ninth controllable switch, and is coupled to the fifteenth controllable switch.

10. The scan driving circuit of claim 5, further comprising: a storage capacitor and a pull-down assembly; wherein the pull-up control assembly comprises a seventeenth controllable switch; an output end of the seventeenth controllable switch is coupled to the control end of the pull-up assembly, and the pull-up control signal is sent to control an input end of the seventeenth controllable switch; the pull-up assembly comprises an eighteenth controllable switch, a control end of the eighteenth controllable switch is coupled to the output end of the pull-up control assembly, the clock scanning signal is sent to an input end of the eighteenth controllable switch, and an output end of the eighteenth controllable switch is coupled to the current scanning line;

wherein a first end of the storage capacitor is coupled to the output end of the pull-up control assembly and the control end of the pull-up assembly, and a second end of the storage capacitor is coupled to the output end of the pull-up assembly; the pull-down assembly comprises a twentieth controllable switch and a twenty-first controllable switch; control ends of the twentieth controllable switch and the twenty-first controllable switch are coupled to a next-stage scanning line, the reference low-level signal is sent to output ends of the twentieth controllable switch and the twenty-first controllable switch, an input end of the twentieth controllable switch is coupled to the current scanning line, and an input end of the twenty-first controllable switch is coupled to the output end of the pull-up control assembly.

11. A liquid crystal display (LCD) device, comprising:
a scan driving circuit;
wherein the scan driving circuit comprises a repair assembly, a pull-up assembly, a pull-up control assembly that drives the pull-up assembly, a pull-down maintaining assembly, a reference low-level signal, and a turn-off unit; an output end of the pull-up assembly is coupled to a current scanning line, a clock scanning signal is sent to an input end of the pull-up assembly, and a control end of the pull-up assembly is coupled to an output end of the pull-up control assembly; a pull-up control signal is sent to a control end of the pull-up control assembly, and the reference low-level signal is sent to the output end of the pull-up control assembly and the current scanning line through the pull-down maintaining assembly; an input end of the pull-down maintaining assembly is coupled to the output end of the pull-up control assembly, and the reference low-level signal is sent to an output end of the pull-down maintaining assembly; an input end of the turn-off unit is coupled to the output end of the pull-down maintaining assembly, a control end of the turn-off unit is coupled to the output end of the pull-up control assembly, and the reference low-level signal is sent to an output end of the turn-off unit; an input end of the repair assembly is coupled to the output end of the pull-down maintaining assembly, the reference low-level signal is sent to an output end of the repair assembly through the turn-off unit, and a control end of the repair assembly is coupled to the output end of the pull-up control assembly;
when the pull-down maintaining assembly turns off in a work stage of the current scanning line, the repair assembly turns off; when the pull-down maintaining assembly turns on in the work stage of the current scanning line, the repair assembly is connected with the pull-down maintaining assembly; in the work stage of the current scanning line, the reference low-level signal is sent to the repair assembly via the turn-off unit, and turns off the pull-down maintaining assembly through the repair assembly.

12. The LCD device of claim 11, wherein the pull-down maintaining assembly comprises a first pull-down maintaining assembly; the first pull-down maintaining assembly comprises a first pull-down maintaining unit and a first pull-down maintaining control unit that drives the first pull-down maintaining unit; the first pull-down maintaining unit comprises a second controllable switch; the scan driving circuit further comprises a first pull-down maintaining signal and a second pull-down maintaining signal; logical operation of the first pull-down maintaining signal is opposite to logical operation of the second pull-down maintaining signal; the first pull-down maintaining control unit comprises a third controllable switch, a fourth controllable switch, and a fifth controllable switch; an input end of the second controllable switch is coupled to the output end of the pull-up control assembly, the reference low-level signal is sent to an output end of the second controllable switch, and a control end of the second controllable switch is coupled to the input end of the repair assembly;

the first pull-down maintaining signal is sent to a control end and an input end of the third controllable switch, and an output end of the third controllable switch is coupled to a control end of the fourth controllable switch; the second pull-down maintaining signal is sent to a control end of the fifth controllable switch, the first pull-down maintaining signal is sent to an input end of the fifth controllable switch, and an output end of the fifth controllable switch is coupled to the control end of the second controllable switch; the first pull-down maintaining signal is sent to an input end of the fourth controllable switch, and an output end of the fourth controllable switch is coupled to the control end of the second controllable switch;

wherein the first pull-down maintaining assembly further comprises a first controllable switch, an input end of the first controllable switch is coupled to the current scanning line, the reference low-level signal is sent to an output end of the first controllable switch, and a control end of the first controllable switch is coupled to the input end of the repair assembly; the control end of the first controllable switch is coupled to the output end of the fourth controllable switch and the control end of the second controllable switch;

when the first and the second controllable switches turn off in the work stage of the current scanning line, the repair assembly turns off; when the first and the second controllable switches turn on in the work stage of the current scanning line, the repair assembly turns on; in the work stage of the current scanning line, the reference low-level signal is sent to the repair assembly via the turn-off unit, and reduces electric potentials of the control ends of the first and the second controllable switches through the repair assembly to turn off the first and the second controllable switches;

wherein the turn-off unit comprises a sixth controllable switch and a thirteenth controllable switch;

wherein the pull-down maintaining assembly further comprises a second pull-down maintaining assembly; the second pull-down maintaining assembly comprises a second pull-down maintaining unit and a second pull-down maintaining control unit that drives the second pull-down maintaining unit; the second pull-down maintaining unit comprises an eighth controllable switch and a ninth controllable switch; the second pull-down maintaining control unit comprises a tenth controllable switch, an eleventh controllable switch, and a twelfth controllable switch;

wherein an input end of the ninth controllable switch is couple to the output end of the pull-up control assembly, the reference low-level signal is sent to an output end of the ninth controllable switch, and a control end of the ninth controllable switch is coupled to the input end of the repair assembly;

wherein an input end of the eighth controllable switch is coupled to the current scanning line, the reference low-level signal is sent to an output end of the eighth controllable switch, and a control end of the eighth controllable switch is coupled to the input end of the repair assembly; the control end of the eighth controllable switch is coupled to an output end of the eleventh controllable switch and the control end of the second controllable switch;

wherein the second pull-down maintaining signal is sent to a control end and an input end of the tenth controllable switch, and an output end of the tenth controllable switch is coupled to a control end of the eleventh controllable switch; the first pull-down maintaining signal is sent to a control end of the twelfth controllable switch, the second pull-down maintaining signal is sent to an input end of the twelfth controllable switch, and an output end of the twelfth controllable switch is coupled to the control ends of the eighth and the ninth controllable switches; the second pull-down maintaining signal is sent to an input end of the eleventh controllable switch, and the output end of the eleventh controllable switch is coupled to the control ends of the eighth and the ninth controllable switches;

when the first controllable switch, the second controllable switch, the eighth controllable switch, and the ninth controllable switch turn off in the work stage of the current scanning line, the repair assembly turns off; when the first controllable switch, the second controllable switch, the eighth controllable switch, and the ninth controllable switch turn on in the work stage of the current scanning line, the repair assembly turns on; in the work stage of the current scanning line, the reference low-level signal is sent to the repair assembly via the turn-off unit, and reduces electric potentials of the control ends of the first controllable switch, the second controllable switch, the eighth controllable switch, and the ninth controllable switch through the repair assembly to turn off the first controllable switch, the second controllable switch, the eighth controllable switch, and the ninth controllable switch.

13. The LCD device of claim 12, wherein the scan driving circuit further comprises a fifteenth controllable switch; a control end of the fifteenth controllable switch is coupled to the output end of the pull-up control assembly, and an input end of the fifteenth controllable switch is coupled to the control ends of the first and the second controllable switches, and an output end of the fifteenth controllable switch is coupled to the control ends of the eighth and the ninth controllable switches;

when the first controllable switch, the second controllable switch, the eighth controllable switch, and the ninth controllable switch turn off in the work stage of the current scanning line, the repair assembly turns off; when the first controllable switch, the second controllable switch, the eighth controllable switch, and the ninth controllable switch turn on in the work stage of the current scanning line because one or more of the fifth controllable switch, the twelfth controllable switch, and the fifteenth controllable switch do not work, the repair assembly turns on; in the work stage of the current scanning line, the reference low-level signal is sent to the repair assembly via the turn-off unit, and reduces the electric potentials of the control ends of the first controllable switch, the second controllable switch, the eighth controllable switch, and the ninth controllable switch through the repair assembly to turn off the first controllable switch, the second controllable switch, the eighth controllable switch, and the ninth controllable switch.

14. The LCD device of claim 13, wherein control ends of the sixth controllable switch and the thirteenth controllable switch are coupled to the output end of the pull-up control assembly, the reference low-level signal is sent to output ends of the sixth controllable switch and the thirteenth controllable switch, an input end of the six controllable switch is coupled to the control ends of the first controllable switch and the second controllable switch, and an input end of the thirteenth controllable switch is coupled to the control ends of the eighth controllable switch and the ninth controllable switch;

wherein the repair assembly comprises a first connecting unit and a second connecting unit; the first connecting unit comprises a first sheet metal, a second sheet metal, and a first insulator; the second connecting unit comprises a third sheet metal, a fourth sheet metal, and a second insulator; the first insulator is arranged between the first sheet metal and the second sheet metal, the second insulator is arranged between the third sheet metal and the fourth sheet metal; the first sheet metal is coupled to the control ends of the first controllable switch and the second controllable switch, and the reference low-level signal is sent to the second sheet metal through the sixth controllable switch; the third sheet metal is coupled to the control ends of the eighth controllable switch and the ninth controllable switch, and the reference low-level signal is sent to the fourth sheet metal through the thirteenth controllable switch;

when the first controllable switch, the second controllable switch, the eighth controllable switch, and the ninth controllable switch turn on in the work stage of the current scanning line because one or more of the fifth controllable switch, the twelfth controllable switch, and the fifteenth controllable switch do not work, insulation function of the first insulator and the second insulator are in failure, the first sheet metal is connected with the second sheet metal, and the third sheet metal is connected with the fourth sheet metal; in the work stage of the current scanning line, the reference low-level signal is sent to the repair assembly via the sixth controllable switch and the thirteenth controllable switch, and reduces the electric potentials of the control ends of the first controllable switch, the second controllable switch, the eighth controllable switch, and the ninth controllable switch through the repair assembly to turn off the first controllable switch, the second controllable switch, the eighth controllable switch, and the ninth controllable switch, wherein the scan driving circuit further comprises a first wire, a second wire, a third wire, and a fourth wire; the repair assembly further comprises a first via hole unit and a second via hole unit; a first end of the first via hole unit is coupled to the third wire, and a second end of the first via hole unit is coupled to the first wire through the first connecting unit; a first end of the second via hole unit is coupled to the fourth wire, and a second end of the second via hole unit is coupled to the second wire through the second connecting unit; the third wire is coupled to the control end of the fourth controllable switch, and the reference low-level signal is sent to the third wire through the sixth controllable switch; the fourth wire is coupled to the control end of the eleventh controllable switch, and the reference low-level signal is sent to the fourth wire through the thirteenth controllable switch; the first wire is coupled to the control ends of the first controllable switch and the second controllable switch, and is coupled to the fifteenth controllable switch; the second wire is coupled to the control ends of the eighth controllable switch and the ninth controllable switch, and is coupled to the fifteenth controllable switch.

15. The LCD device of claim 13, wherein the turn-off unit comprises a twenty-second controllable switch, and a twenty-third controllable switch; control ends of the sixth controllable switch, the thirteenth controllable switch, the twenty-second controllable switch, and the twenty-third controllable switch are coupled to the output end of the pull-up control assembly; the reference low-level signal is sent to output ends of the sixth controllable switch, the thirteenth controllable switch, the twenty-second controllable switch, and the twenty-third controllable switch; an input end of the twenty-second controllable switch is coupled to the control ends of the first controllable switch and the second controllable switch, an input end of the sixth controllable switch is coupled to the control end of the fourth controllable switch, an input end of the twenty-third controllable switch is coupled to the control ends of the eighth controllable switch and the ninth controllable switch, and an input end of the thirteenth controllable switch is coupled to the control end of the eleventh controllable switch;

wherein the repair assembly comprises a first connecting unit and a second connecting unit; the first connecting unit comprises a first sheet metal, a second sheet metal, and a first insulator; the second connecting unit comprises a third sheet metal, a fourth sheet metal, and a second insulator; the first insulator is arranged between the first sheet metal and the second sheet metal, the second insulator is arranged between the third sheet metal and the fourth sheet metal; the first sheet metal is coupled to the control ends of the first controllable switch and the second controllable switch, and the reference low-level signal is sent to the second sheet metal through the twenty-second controllable switch; the third sheet metal is coupled to the control ends of the eighth controllable switch and the ninth controllable switch, and the reference low-level signal is sent to the fourth sheet metal through the twenty-third controllable switch;

when the first controllable switch, the second controllable switch, the eighth controllable switch, and the ninth controllable switch turn on in the work stage of the current scanning line because one or more of the fifth controllable switch, the twelfth controllable switch, and the fifteenth controllable switch do not work, insulation function of the first insulator and the second insulator are in failure, the first sheet metal is connected with the second sheet metal, and the third sheet metal is connected with the fourth sheet metal; in the work stage of the current scanning line, the reference low-level signal is sent to the repair assembly via the twenty-second and the twenty-third controllable switches, and reduces the electric potentials of the control ends of the first controllable switch, the second controllable switch, the eighth controllable switch, and the ninth controllable switch through the repair assembly to turn off the first controllable switch, the second controllable switch, the eighth controllable switch, and the ninth controllable switch, wherein the scan driving circuit further comprises a first wire and a second wire; the repair assembly further comprises a first via hole unit and a second via hole unit; a first end of the first connecting unit is coupled to the first wire through the first via hole unit, and the reference low-level signal is sent to a second end of the first connecting unit through the twenty-second controllable switch; a first end of the second connecting unit is coupled to the second wire through the second via hole unit, and the reference low-level signal is sent to a second end of the second connecting unit through the twenty-third controllable switch; the first wire is coupled to the control ends of the first controllable switch and the second controllable switch, and is coupled to the fifteenth controllable switch; the second wire is coupled to the control ends of the eighth controllable switch and the ninth controllable switch, and is coupled to the fifteenth controllable switch.

16. The LCD device of claim 13, wherein the pull-up control assembly comprises a seventeenth controllable switch, an output end of the seventeenth controllable switch is coupled to the control end of the pull-up assembly, and the pull-up control signal is sent to control an input end of the seventeenth controllable switch; the pull-up assembly comprises an eighteenth controllable switch, a control end of the eighteenth controllable switch is coupled to the output end of the pull-up control assembly, the clock scanning signal is sent to an input end of the eighteenth controllable switch, and an output end of the eighteenth controllable switch is coupled to the current scanning line; the scan driving circuit further comprises a storage capacitor, a first end of the storage capacitor is coupled to the output end of the pull-up control assembly and the control end of the pull-up assembly, and a second end of the storage capacitor is coupled to the output end of the pull-up assembly; the scan driving circuit further comprises a pull-down assembly comprising a twentieth controllable switch and a twenty-first controllable switch, control ends of the twentieth controllable switch and the twenty-first controllable switch are coupled to a next scanning line, the reference low-level signal is sent to output ends of the twentieth controllable switch and the twenty-first controllable switch, an input end of the twentieth controllable switch is coupled to the current scanning line, and an input end of the twenty-first controllable switch is coupled to the output end of the pull-up control assembly.

* * * * *